(12) United States Patent
Makansi et al.

(10) Patent No.: US 10,571,162 B2
(45) Date of Patent: *Feb. 25, 2020

(54) INTEGRATION OF DISTRIBUTED THERMOELECTRIC HEATING AND COOLING

(71) Applicant: Tempronics, Inc., Tucson, AZ (US)

(72) Inventors: Tarek Makansi, Tucson, AZ (US); Michael J. Berman, Tucson, AZ (US); John Latimer Franklin, Tucson, AZ (US); Mark Nelsen Evers, Tucson, AZ (US); Steven Wood, Tucson, AZ (US)

(73) Assignee: Tempronics, Inc., Tucson, AZ (US)

( * ) Notice: Subject to any disclaimer, the term of this patent is extended or adjusted under 35 U.S.C. 154(b) by 166 days.

This patent is subject to a terminal disclaimer.

(21) Appl. No.: 15/426,733

(22) Filed: Feb. 7, 2017

(65) Prior Publication Data

US 2017/0159980 A1      Jun. 8, 2017

Related U.S. Application Data

(63) Continuation of application No. 13/541,530, filed on Jul. 3, 2012, now Pat. No. 9,596,944.
(Continued)

(51) Int. Cl.
*F25B 21/04* (2006.01)
*A41D 13/002* (2006.01)

(52) U.S. Cl.
CPC .......... *F25B 21/04* (2013.01); *A41D 13/0025* (2013.01); *F25B 2321/023* (2013.01);
(Continued)

(58) Field of Classification Search
CPC .............. F25B 21/04; F25B 2321/0212; F25B 2321/023; A61F 2007/0075; A41D 13/0025; H05B 2203/007
See application file for complete search history.

(56) References Cited

U.S. PATENT DOCUMENTS

| 2,376,902 A | 5/1945 | Clark |
| RE22,763 E | 6/1946 | Clark |

(Continued)

FOREIGN PATENT DOCUMENTS

| CN | 1898522 A | 1/2007 |
| CN | 201636597 U | 11/2010 |

(Continued)

OTHER PUBLICATIONS

Aimi, et al. Thermotunneling Based on Cooling Systems for High Efficiency Buildings. General Electric Global Research Center, DOE Report Identifier DE-FC26-04NT42324, 2007.
(Continued)

*Primary Examiner* — David J Teitelbaum
(74) *Attorney, Agent, or Firm* — Wilson Sonsini Goodrich & Rosati

(57) ABSTRACT

A thermoelectric device including a panel, formed of a thermally insulating material, and having a plurality of thermoelectric elements including compacted conductors inside the insulating material and expanded conductors outside the insulating material wherein the thermoelectric elements run substantially parallel to or at an acute angle relative to the long dimension of the panel. The thermoelectric device may be integrated into a variety of surfaces or enclosures needing heating or cooling with controls and configurations to optimize the application.

20 Claims, 16 Drawing Sheets

Related U.S. Application Data

(60) Provisional application No. 61/504,784, filed on Jul. 6, 2011, provisional application No. 61/564,404, filed on Nov. 29, 2011, provisional application No. 61/587,729, filed on Jan. 18, 2012.

(52) U.S. Cl.
CPC ............... *F25B 2321/0212* (2013.01); *F25B 2321/0251* (2013.01); *H05B 2203/007* (2013.01)

(56) References Cited

U.S. PATENT DOCUMENTS

| | | | |
|---|---|---|---|
| 2,606,996 A | 8/1952 | Westerberg et al. | |
| 2,796,532 A | 6/1957 | Teague et al. | |
| 2,858,350 A | 10/1958 | Fritts et al. | |
| 3,083,381 A | 4/1963 | Bailey | |
| 3,129,345 A | 4/1964 | Hatsopoulos et al. | |
| 3,136,577 A | 6/1964 | Richard | |
| 3,173,032 A | 3/1965 | Maynard | |
| 3,196,524 A | 7/1965 | Jamison | |
| 3,217,189 A | 11/1965 | Bloss | |
| 3,225,549 A | 12/1965 | Elfving | |
| 3,406,753 A | 10/1968 | Habdas | |
| 3,549,201 A | 12/1970 | Earl | |
| 3,627,988 A | 12/1971 | Charles | |
| 3,754,703 A | 8/1973 | Saponara | |
| 4,343,993 A | 8/1982 | Binnig et al. | |
| 4,423,308 A | 12/1983 | Callaway et al. | |
| 4,523,594 A | 6/1985 | Kuznetz | |
| 4,610,142 A * | 9/1986 | Davis ................ H01H 37/585 219/495 | |
| 4,625,394 A | 12/1986 | Kemnitz et al. | |
| 4,820,903 A | 4/1989 | Ishida | |
| 4,825,488 A | 5/1989 | Bedford | |
| 4,825,868 A | 5/1989 | Susa et al. | |
| 4,930,317 A | 6/1990 | Klein | |
| 4,937,435 A | 6/1990 | Goss et al. | |
| 4,969,684 A | 11/1990 | Zarotti | |
| 5,028,835 A | 7/1991 | Fitzpatrick | |
| 5,138,851 A | 8/1992 | Mardikian | |
| 5,541,464 A | 7/1996 | Johnson et al. | |
| 5,594,534 A | 1/1997 | Genovese | |
| 5,653,741 A | 8/1997 | Grant | |
| 5,712,448 A | 1/1998 | Vandersande et al. | |
| 5,837,002 A | 11/1998 | Augustine et al. | |
| 5,851,338 A | 12/1998 | Pushaw | |
| 5,892,656 A | 4/1999 | Bass | |
| 5,917,229 A | 6/1999 | Nathan et al. | |
| 6,064,137 A | 5/2000 | Cox | |
| 6,129,990 A | 10/2000 | Frater | |
| 6,220,659 B1 | 4/2001 | McDowell et al. | |
| 6,223,539 B1 | 5/2001 | Bell | |
| 6,230,501 B1 | 5/2001 | Bailey, Sr. et al. | |
| 6,323,413 B1 | 11/2001 | Roth et al. | |
| 6,323,777 B1 | 11/2001 | Durston et al. | |
| 6,328,594 B1 | 12/2001 | Mullen, Jr. | |
| 6,385,976 B1 | 5/2002 | Yamamura et al. | |
| 6,410,971 B1 | 6/2002 | Otey | |
| 6,494,048 B1 | 12/2002 | Ghoshal et al. | |
| 6,501,055 B2 | 12/2002 | Rock et al. | |
| 6,523,354 B1 | 2/2003 | Tolbert | |
| 6,582,456 B1 | 6/2003 | Hand et al. | |
| 6,639,242 B1 | 10/2003 | Chen et al. | |
| 6,651,760 B2 | 11/2003 | Cox et al. | |
| 6,653,607 B2 | 11/2003 | Ellis et al. | |
| 6,720,704 B1 | 4/2004 | Tavkhelidze et al. | |
| 6,774,003 B2 | 8/2004 | Tavkhelidze et al. | |
| 6,823,678 B1 | 11/2004 | Li | |
| 6,863,981 B2 | 3/2005 | McBain | |
| 6,876,123 B2 | 4/2005 | Martinovsky et al. | |
| 6,884,732 B2 | 4/2005 | Najafi et al. | |
| 6,946,596 B2 | 9/2005 | Kucherov et al. | |
| 7,005,381 B1 | 2/2006 | Cox | |
| 7,117,687 B2 | 10/2006 | Naaman | |
| 7,140,102 B2 | 11/2006 | Taliashvili et al. | |
| 7,152,412 B2 | 12/2006 | Harvie | |
| 7,253,549 B2 | 8/2007 | Tavkhelidze et al. | |
| 7,273,490 B2 | 9/2007 | Lachenbruch et al. | |
| 7,305,839 B2 | 12/2007 | Weaver, Jr. et al. | |
| 7,456,543 B2 | 11/2008 | Makansi | |
| 7,708,338 B2 | 5/2010 | Wolas | |
| 7,996,936 B2 | 8/2011 | Marquette et al. | |
| 8,018,117 B2 | 9/2011 | Makansi | |
| 8,066,324 B2 | 11/2011 | Nathan et al. | |
| 8,101,847 B2 | 1/2012 | Okamura | |
| 8,102,096 B2 | 1/2012 | Makansi | |
| 8,327,477 B2 | 12/2012 | Lachenbruch et al. | |
| 8,495,974 B2 | 7/2013 | Agosta | |
| 8,969,703 B2 | 3/2015 | Makansi et al. | |
| 9,066,601 B1 | 6/2015 | Aminy et al. | |
| 9,272,647 B2 | 3/2016 | Gawade et al. | |
| 9,408,475 B2 | 8/2016 | Mikkelsen et al. | |
| 9,596,944 B2 | 3/2017 | Makansi et al. | |
| 9,638,442 B2 | 5/2017 | Makansi et al. | |
| 2001/0011601 A1 | 8/2001 | Renaud | |
| 2001/0046749 A1 | 11/2001 | Tavkhelidze et al. | |
| 2002/0046762 A1 | 4/2002 | Rossi | |
| 2002/0058975 A1 | 5/2002 | Bieberich | |
| 2002/0170172 A1 | 11/2002 | Tavkhelidze et al. | |
| 2003/0042819 A1 | 3/2003 | Martinovsky et al. | |
| 2003/0084935 A1 | 5/2003 | Bell | |
| 2003/0131419 A1 | 7/2003 | Vansteenburg | |
| 2003/0141455 A1 | 7/2003 | Lambert et al. | |
| 2003/0154725 A1 | 8/2003 | McGrew | |
| 2003/0184188 A1 | 10/2003 | Kucherov et al. | |
| 2003/0230913 A1 | 12/2003 | Buss et al. | |
| 2004/0009729 A1 | 1/2004 | Hill et al. | |
| 2004/0050415 A1 | 3/2004 | Kucherov et al. | |
| 2004/0100131 A1 | 5/2004 | Howick et al. | |
| 2004/0160092 A1 | 8/2004 | Laib | |
| 2004/0195934 A1 | 10/2004 | Tanielian | |
| 2005/0050415 A1 | 3/2005 | Anand et al. | |
| 2005/0066505 A1 | 3/2005 | Iqbal et al. | |
| 2005/0077618 A1 | 4/2005 | McCutcheon et al. | |
| 2005/0140189 A1 | 6/2005 | Bajic et al. | |
| 2005/0184565 A1 | 8/2005 | Weiss et al. | |
| 2005/0184603 A1 | 8/2005 | Martsinovsky | |
| 2005/0189871 A1 | 9/2005 | Tavkhelidze et al. | |
| 2005/0253425 A1 | 11/2005 | Asada et al. | |
| 2006/0000226 A1 | 1/2006 | Weaver, Jr. et al. | |
| 2006/0027552 A1 | 2/2006 | Krobok et al. | |
| 2006/0038290 A1 | 2/2006 | Tavkhelidze et al. | |
| 2006/0068176 A1 | 3/2006 | Zafiroglu et al. | |
| 2006/0110657 A1 | 5/2006 | Stanton et al. | |
| 2006/0138896 A1 | 6/2006 | Makansi | |
| 2006/0162761 A1 | 7/2006 | Tanielian | |
| 2006/0180829 A1 | 8/2006 | Martsinovsky | |
| 2006/0191886 A1 | 8/2006 | Pak, II | |
| 2006/0192196 A1 | 8/2006 | Tavkhelidze et al. | |
| 2006/0207643 A1 | 9/2006 | Weaver, Jr. et al. | |
| 2007/0001507 A1 | 1/2007 | Brennan et al. | |
| 2007/0023077 A1 | 2/2007 | Tanielian | |
| 2007/0033782 A1 | 2/2007 | Taliashvili et al. | |
| 2007/0056623 A1 | 3/2007 | Tavkhelidze et al. | |
| 2007/0069357 A1 | 3/2007 | Weaver et al. | |
| 2007/0084220 A1 | 4/2007 | Asada et al. | |
| 2007/0112390 A1 | 5/2007 | Lau et al. | |
| 2007/0137687 A1 | 6/2007 | Tanielian | |
| 2007/0181913 A1 | 8/2007 | Li | |
| 2007/0272673 A1 | 11/2007 | Keane | |
| 2007/0277313 A1 | 12/2007 | Terech et al. | |
| 2007/0289620 A1 | 12/2007 | Stark | |
| 2007/0295973 A1 | 12/2007 | Jinbo et al. | |
| 2008/0015665 A1 | 1/2008 | Lachenbruch | |
| 2008/0017237 A1 | 1/2008 | Bray et al. | |
| 2008/0029146 A1 | 2/2008 | Plissonnier et al. | |
| 2008/0042163 A1 | 2/2008 | Weaver, Jr. et al. | |
| 2008/0054490 A1 | 3/2008 | McLellan et al. | |
| 2008/0155981 A1 | 7/2008 | Tanielian | |
| 2008/0173022 A1 | 7/2008 | Petrovski | |
| 2008/0237827 A1 | 10/2008 | Autry | |
| 2009/0025774 A1 | 1/2009 | Plissonnier et al. | |

(56) References Cited

U.S. PATENT DOCUMENTS

| | | |
|---|---|---|
| 2009/0038317 A1 | 2/2009 | Otey |
| 2009/0078690 A1 | 3/2009 | Lee et al. |
| 2009/0121524 A1 | 5/2009 | Abe et al. |
| 2009/0199571 A1 | 8/2009 | Creech et al. |
| 2009/0200983 A1 | 8/2009 | Dyer et al. |
| 2009/0205695 A1 | 8/2009 | Makansi |
| 2009/0229648 A1 | 9/2009 | Makansi |
| 2009/0257774 A1 | 10/2009 | Rummler et al. |
| 2009/0283124 A1 | 11/2009 | Seo |
| 2009/0322221 A1 | 12/2009 | Makansi |
| 2010/0031448 A1 | 2/2010 | Hijlkema |
| 2010/0101620 A1 | 4/2010 | Tanaka |
| 2010/0107657 A1 | 5/2010 | Vistakula |
| 2010/0269517 A1 | 10/2010 | Ikeda et al. |
| 2010/0270996 A1 | 10/2010 | Ramadas et al. |
| 2010/0281884 A1 | 11/2010 | Rawski et al. |
| 2010/0288370 A1 | 11/2010 | Volden et al. |
| 2010/0327636 A1 | 12/2010 | Stoll et al. |
| 2011/0016886 A1 | 1/2011 | Ghoshal et al. |
| 2011/0109128 A1 | 5/2011 | Axakov et al. |
| 2011/0139203 A1 | 6/2011 | Yap |
| 2011/0226299 A1 | 9/2011 | Makansi |
| 2011/0240751 A1 | 10/2011 | Rauh et al. |
| 2012/0019074 A1 | 1/2012 | Frolov et al. |
| 2012/0032478 A1 | 2/2012 | Friderich et al. |
| 2012/0060882 A1 | 3/2012 | Makansi |
| 2012/0060885 A1 | 3/2012 | Makansi et al. |
| 2012/0110734 A1 | 5/2012 | An |
| 2012/0113594 A1 | 5/2012 | Goettert et al. |
| 2012/0131748 A1 | 5/2012 | Brykalski et al. |
| 2012/0146455 A1 | 6/2012 | Makansi |
| 2012/0148328 A1 | 6/2012 | Jollet |
| 2012/0198616 A1 | 8/2012 | Makansi et al. |
| 2012/0266930 A1 | 10/2012 | Toyoda et al. |
| 2013/0008181 A1 | 1/2013 | Makansi et al. |
| 2013/0014796 A1 | 1/2013 | Tajima |
| 2013/0097777 A1 | 4/2013 | Marquette et al. |
| 2013/0106147 A1 | 5/2013 | Lazanja et al. |
| 2013/0180563 A1 | 7/2013 | Makansi |
| 2014/0041396 A1 | 2/2014 | Makansi et al. |
| 2014/0082846 A1 | 3/2014 | Blazar |
| 2014/0208521 A1 | 7/2014 | Farnham |
| 2014/0326287 A1 | 11/2014 | Wiant et al. |
| 2014/0331688 A1 | 11/2014 | Kossakovski et al. |
| 2015/0121901 A1 | 5/2015 | Makansi et al. |
| 2015/0207052 A1 | 7/2015 | Carr |
| 2015/0219368 A1 | 8/2015 | Makansi et al. |
| 2015/0266405 A1 | 9/2015 | Robert et al. |
| 2016/0133817 A1 | 5/2016 | Makansi et al. |

FOREIGN PATENT DOCUMENTS

| | | |
|---|---|---|
| CN | 103098249 A | 5/2013 |
| DE | 4010909 A1 | 10/1991 |
| EP | 1612492 A1 | 1/2006 |
| GB | 2065465 A | 7/1981 |
| JP | S34595 B1 | 2/1959 |
| JP | S6147907 A | 3/1986 |
| JP | S62159610 A | 7/1987 |
| JP | S63257513 A | 10/1988 |
| JP | H02116613 U | 9/1990 |
| JP | H03247315 A | 11/1991 |
| JP | H09197806 A | 7/1997 |
| JP | 2002084005 A | 3/2002 |
| JP | 2002519100 A | 7/2002 |
| JP | 2003042590 A | 2/2003 |
| JP | 2003209297 A | 7/2003 |
| JP | 2003526484 A | 9/2003 |
| JP | 2006081575 A | 3/2006 |
| JP | 2007175476 A | 7/2007 |
| JP | 2008538850 A | 11/2008 |
| JP | 2009074746 A | 4/2009 |
| JP | 2009183354 A | 8/2009 |
| JP | 2010240258 A | 10/2010 |
| JP | 2011014281 A | 1/2011 |
| JP | 2011204824 A | 10/2011 |
| JP | 2011211896 A | 10/2011 |
| JP | 2013198730 A | 10/2013 |
| JP | 2015168357 A | 9/2015 |
| WO | WO-9811397 A1 | 3/1998 |
| WO | WO-9913562 A1 | 3/1999 |
| WO | WO-2007078048 A1 | 7/2007 |
| WO | WO-2007100941 A2 | 9/2007 |
| WO | WO-2008027928 A2 | 3/2008 |
| WO | WO-2009102706 A2 | 8/2009 |
| WO | WO-2010078521 A1 | 7/2010 |
| WO | WO-2010108254 A1 | 9/2010 |
| WO | WO-2010150162 A1 | 12/2010 |
| WO | WO-2012037031 A1 | 3/2012 |
| WO | WO-2013006640 A1 | 1/2013 |
| WO | WO-2014025495 A1 | 2/2014 |
| WO | WO-2014052145 A1 | 4/2014 |
| WO | WO-2015066518 A1 | 5/2015 |
| WO | WO-2016073939 A1 | 5/2016 |
| WO | WO-2016130840 A1 | 8/2016 |

OTHER PUBLICATIONS

Australian Examination Report dated Aug. 19, 2013 for Application No. 2011/002303.

Chinese Office Action (with translation) dated Apr. 3, 2015 for Application No. 201180043196.7.

Chinese Office Action (with translation) dated Jun. 16, 2015 for Application No. 201280033604.5.

Choi, et al. Selective Epitaxial Growth of SiGe on a SOI Substrate by Using Ultra-High Vacuum Chemical Vapor Deposition. Journal of the Korean Physical Society, vol. 48, No. 4, Apr. 2006, pp. 648-652.

Cronin, et al. Electronic Properties of Bismuth Nanowires. Dept of Physics, Electrical Engineering and Computer Science, Chemistry and Francis Bitter Magnet Laboratory, Massachusetts Institute of Technology, Cambridge, MA 02139.

Dimatteo, et al. Micron-gap ThermoPhotoVoltaics (MTPV). Thermophotovoltaic Generation of Electricity Sixth Conference, American Institute of Physics, 2004.

Enikov, et al. Analysis of Nanonmeter Vacuum Gap Formation in Thermo-tunneling Devices. Nanotechnology, vol. 19, No. 7, Published Jan. 31, 2008.

European Communication dated May 27, 2011 for Application No. 07 756 398.9-2208.

European Communication dated Jun. 1, 2011 for Application No. 07 814 511.7-2208.

European Office Action dated Apr. 1, 2015 for Application No. 13828204.1.

European search report and opinion dated May 19, 2016 for Application No. 13828204.1.

European Search Report and Written Opinion dated Apr. 2, 2015 for Application No. 12807127.1.

European Search Report and Written Opinion dated Oct. 12, 2010 for EP Application No. 07556398.9.

European Supplementary Search Report dated Oct. 22, 2010 for Application No. 077814511.7-2208/2057659, PCT/US2007/077042.

Extended European Search Report and Written Opinion dated Nov. 18, 2014 for Application No. 11825739.3.

Ghoshal, et al. Efficient Switched Thermoelectric Refrigerators for Cold Storage Applications. Journal of Electronic Materials. Jul. 2009, vol. 38, Issue 7, pp. 1148-1153.

Hishinuma, et al. Measurements of Cooling by Room Temperature Thermionic Emission Across a Nanometer Gap. J. Appl. Phys. 94, 4690 (2003).

Hishinuma, et al. Vacuum Thermionic Refrigeration with a Semiconductor Heterojunction Structure. Appl. Phys. Lett. 81, 4242 (2002).

Hishinuna, et al. Efficiency of Regrigeration using Thermotunneling and Thermionic Emission in a Vacuum: Use of Nanometer Scale Design. Applied Physics Letters, vol. 78, No. 17, Apr. 23, 2001.

(56) References Cited

OTHER PUBLICATIONS (Also published/previously cited as Refrigeration by combined tunneling and thermionic emission in vacuum: Use of nanometer scale design).
Humphrey, et al. Quantum, Cyclic, and Particle-Exchange Heat Engines. Physica E: Low-Dimensional Systems and Nanostructures. vol. 29, Issues 1-2, Oct. 2005, pp. 390-398.
Indonesian Office Action (no translation) dated Jun. 30, 2015 for Application No. WO0201301075.
International Preliminary Report on Patentability dated Jan. 16, 2014 for PCT Application No. US2012/045443.
International Preliminary Report on Patentability dated Feb. 10, 2015 for PCT Application No. US2013/050378.
International Preliminary Report on Patentability dated Mar. 12, 2009 for PCT Application No. US2007/007042.
International Preliminary Report on Patentability dated Jul. 14, 2011 for PCT Application No. US2009/069959.
International Preliminary Report on Patentability dated Jul. 17, 2014 for PCT Application No. US2012/071838.
International Search Report and the Written Opinion dated Mar. 8, 2013 for PCT Application No. US2012/071838.
International search report and written opinion dated Jan. 21, 2016 for PCT/US2015/059598.
International Search Report and Written Opinion dated Jan. 22, 2007 for PCT Application No. US2007/060871.
International search report and written opinion dated Jan. 29, 2014 for PCT/US2013/060549.
International Search Report and Written Opinion dated Feb. 11, 2015 for PCT Application No. US2014/063511.
International Search Report and Written Opinion dated Mar. 15, 2010 for PCT Application No. US2009/069959.
International Search Report and Written Opinion dated Apr. 15, 2009 for PCT Application No. US2007/060871.
International Search Report and Written Opinion dated Apr. 17, 2009 for PCT Application No. US2009/033660.
International search report and written opinion dated Apr. 22, 2016 for PCT/US2016/017603.
International search report and written opinion dated Jun. 17, 2016 for PCT/US2016/019743.
International Search Report and Written Opinion dated Sep. 5, 2008 for PCT Application No. US2007/077042.
International Search Report and Written Opinion dated Oct. 1, 2012 for PCT Application No. US2012/045443.
International Search Report and Written Opinion dated Dec. 30, 2013 for PCT Application No. US2013/050378.
Jangidze, et al. Electroplating of Conformal Electrodes for Vacuum Nanogap Tunnel Junction. Tbilisi State University, Chavchavadze Ave. 13, 0179, Georgia, Nov. 2008, pp. 1-11.
Korotkov, et al. Possible Cooling by Resonant Fowler-Nordheim Emission. Appl. Phys. Lett. 75, 2491 (1999).
Labounty, et al. Design and Characterization of Thin Film Microcoolers. J. Appl. Phys. 89, 4059 (2001).
Lachenbruch, C. Skin Cooling Surfaces: Estimating the Importance of Limiting Skin Temperature.Ostomy Wound Management. Feb. 2005.
Lauterbach. Smart Clothes Self-Powered by Body Heat. Avantex Symposium, 2002.
Mahan, et al. Multilayer Thermionic Refrigerator. J. Appl. Phys. 83, 4683 (1998).
Mahan, G.D. Thermionic Refrigeration. J. Appl. Phys. 76, 4362 (1994).
McCarthy, et al. Enhancing Thermoelectric Energy Recovery via Modulations of Source Temperature for Cyclical Heat Loadings. Journal of Heat Transfer, Jun. 2007, vol. 129, pp. 749-755 (7 pgs).
Menke, et al. Bismuth Telluride (Bi2Te3)Nanowires: Synthesis by Cyclic Electrodeposition/Stripping, Thinning by Electrooxidation, and Electrical Power Generation. Langmuir, 2006, 22 (25), pp. 10564-10574.
Mexican Office Action dated Mar. 27, 2014 Application No. MX/a/2031/009378.

Mexican Office Action dated Jun. 13, 2013 for Application No. MX/a/2013/002569.
Noro, et al. The Thermoelectric Properties and Crystallography of Bi-Sb-Te-Se Thin Films Grown by Ion Beam Sputtering. J. Appl. Phys. 73, 1252 (1993).
Notice of Allowance dated Nov. 9, 2016 for U.S. Appl. No. 13/541,530.
Office Action dated Feb. 1, 2016 for U.S. Appl. No. 13/541,530.
Office Action dated Feb. 17, 2015 for U.S. Appl. No. 13/541,530.
Office action dated Mar. 21, 2014 for U.S. Appl. No. 13/101,015.
Office action dated Mar. 21, 2016 for U.S. Appl. No. 14/430,596.
Office action dated Jun. 3, 2016 for U.S. Appl. No. 13/940,093.
Office Action dated Jun. 29, 2016 for U.S. Appl. No. 13/394,288.
Office Action dated Jul. 30, 2015 for U.S. Appl. No. 13/541,530.
Office action dated Aug. 10, 2016 for U.S. Appl. No. 14/430,596.
Office Action dated Oct. 14, 2016 for U.S. Appl. No. 14/530,360.
Office Action dated Oct. 16, 2014 for U.S. Appl. No. 13/394,288.
Office Action dated Oct. 21, 2016 for U.S. Appl. No. 13/400,093.
PCT International Search Report and the Written Opinion dated Dec. 23, 2011 for PCT Application No. US2011/051227.
Philippines Examination Report dated Apr. 8, 2015 for Application No. 1/2013/500025.
Philippines Office Action dated Nov. 6, 2014 for Application No. 1/2013/500025.
Snyder, et al. Complex Thermoelectric Materials. Nature Materials, vol. 7 Feb. 2008.
Yin, et al. Strain relaxation of SiGe Islands on Compliant Oxide. Journal of Applied Physics, vol. 91, No. 12, Jun. 15, 2002.
Yonenaga, et al. Thermal and electrical properties of Czochralski grown GeSi single crystals. Journal of Physics and Chemistry of Solids, vol. 62, Issue 7, Jul. 2001, pp. 1313-1317.
Zhdanov, et al. Substrate-Mediated Photo Induced Chemical Reactions on Ultrathin Metal Films. Department of Applied. Physics, Apr. 19, 1999, Surface Science 432 (1999) L599-L603.
Co-pending U.S. Appl. No. 15/468,407, filed Mar. 24, 2017.
Co-pending U.S. Appl. No. 15/662,534, filed Jul. 28, 2017.
Extended European Search Report and Search Opinion dated Jun. 30, 2017 for European Patent Application No. EP14859204.1.
International Search Report and Written Opinion dated Jul. 24, 2017 for International PCT Patent Application No. PCT/US2017/032959.
Notice of allowance dated Jun. 29, 2011 for U.S. Appl. No. 12/302,782.
Notice of allowance dated Jul. 24, 2014 for U.S. Appl. No. 13/101,015.
Notice of allowance dated Sep. 7, 2012 for U.S. Appl. No. 12/367,965.
Notice of allowance dated Sep. 15, 2008 for U.S. Appl. No. 11/344,622.
Notice of allowance dated Nov. 21, 2011 for U.S. Appl. No. 12/376,254.
Notice of Allowance dated Dec. 28, 2016 for U.S. Appl. No. 13/940,093.
Office action dated Mar. 15, 2012 for U.S. Appl. No. 12/367,965.
Office Action dated Mar. 18, 2014 for U.S. Appl. No. 13/394,288.
Office Action dated Mar. 23, 2015 for U.S. Appl. No. 13/394,288.
Office Action dated Mar. 24, 2015 for U.S. Appl. No. 13/728,794.
Office Action dated Apr. 7, 2011 for U.S. Appl. No. 12/302,782.
Office Action dated May 17, 2017 for U.S. Appl. No. 14/530,360.
Office action dated May 21, 2012 for U.S. Appl. No. 13/330,345.
Office Action dated Jun. 12, 2014 for U.S. Appl. No. 13/394,288.
Office Action dated Jun. 13, 2017 for U.S. Appl. No. 14/473,882.
Office Action dated Jun. 29, 2011 for U.S. Appl. No. 12/376,254.
Office action dated Jul. 31, 2015 for U.S. Appl. No. 13/940,093.
Office Action dated Aug. 18, 2014 for U.S. Appl. No. 13/394,288.
Office action dated Nov. 4, 2013 for U.S. Appl. No. 13/101,015.
Office action dated Nov. 13, 2015 for U.S. Appl. No. 13/394,288.
Office Action dated Nov. 14, 2013 for U.S. Appl. No. 13/394,288.
U.S. Appl. No. 15/662,534 Office Action dated Jun. 7, 2019.
Co-pending U.S. Appl. No. 16/249,650, filed Jan. 16, 2019.
EP15858052.2 European Search Report dated Jul. 20, 2018.
Office Action dated Dec. 15, 2017 for U.S. Appl. No. 14/530,360.
U.S. Appl. No. 14/530,360 Notice of Allowance dated Oct. 22, 2018.
U.S. Appl. No. 15/468,407 Notice of Allowance dated Nov. 28, 2018.

(56) References Cited

OTHER PUBLICATIONS

U.S. Appl. No. 15/468,407 Office Action dated Jun. 15, 2018.

* cited by examiner

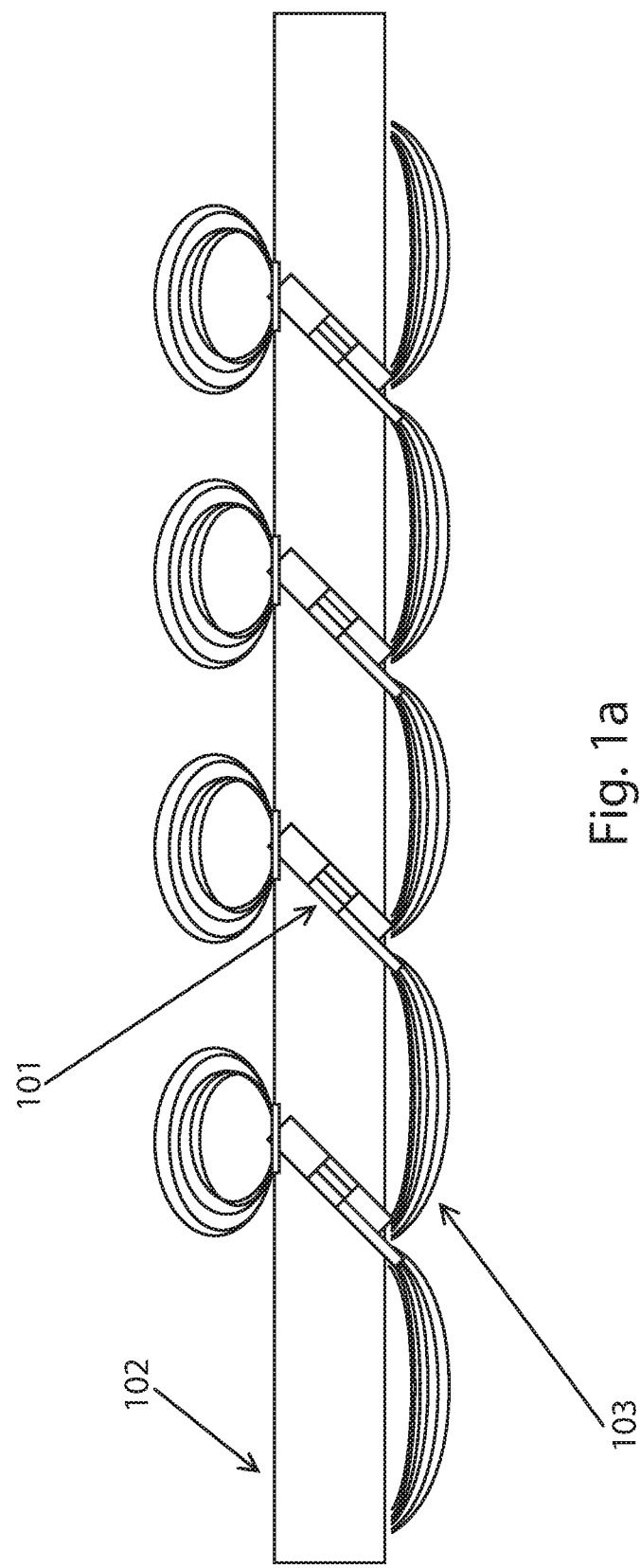

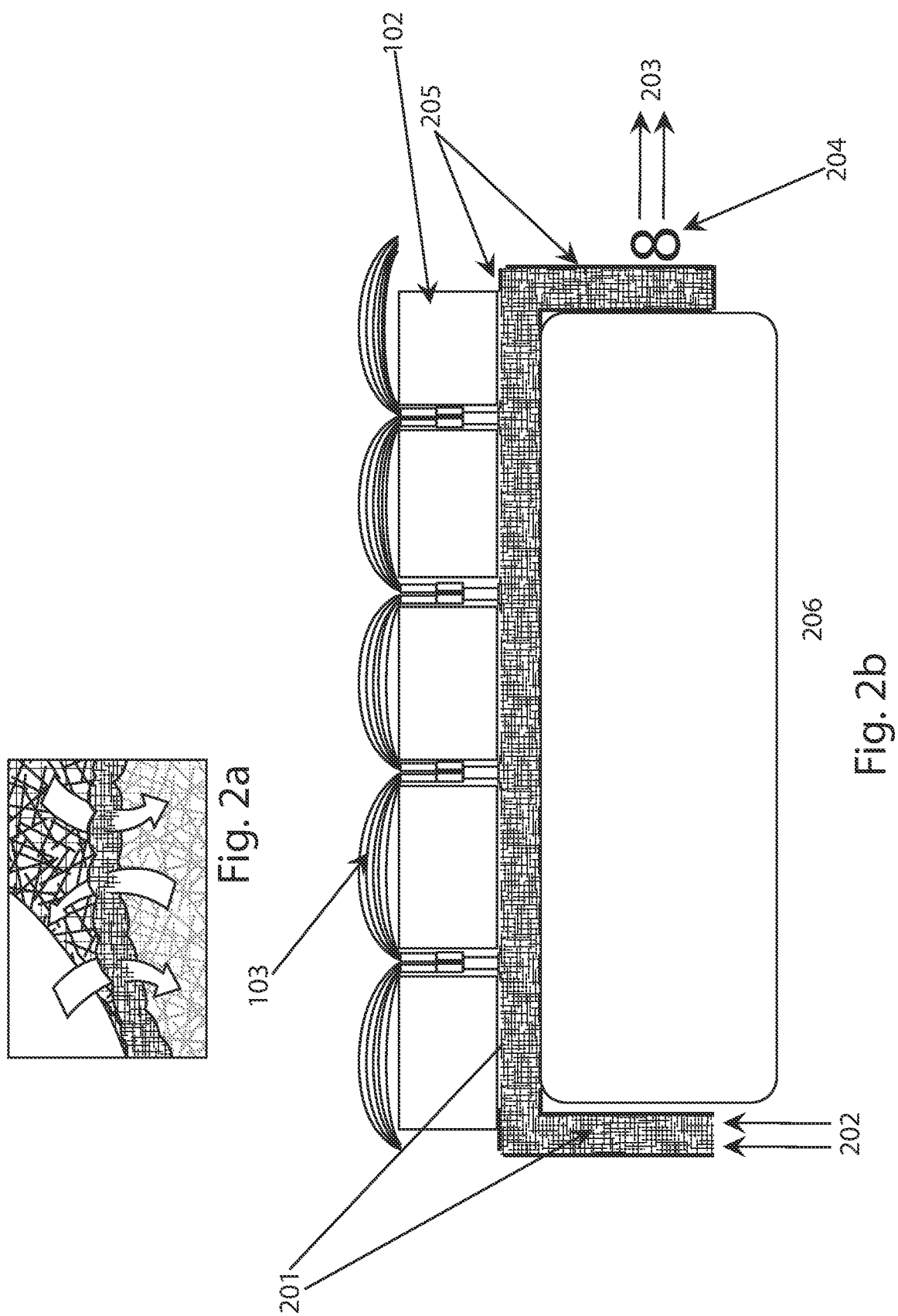

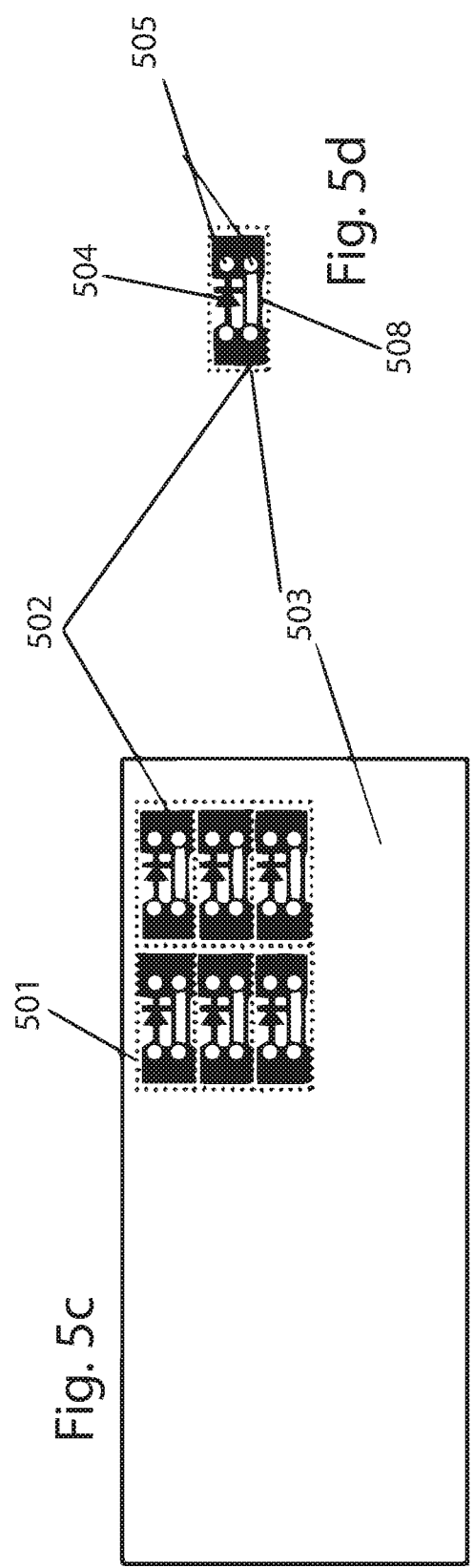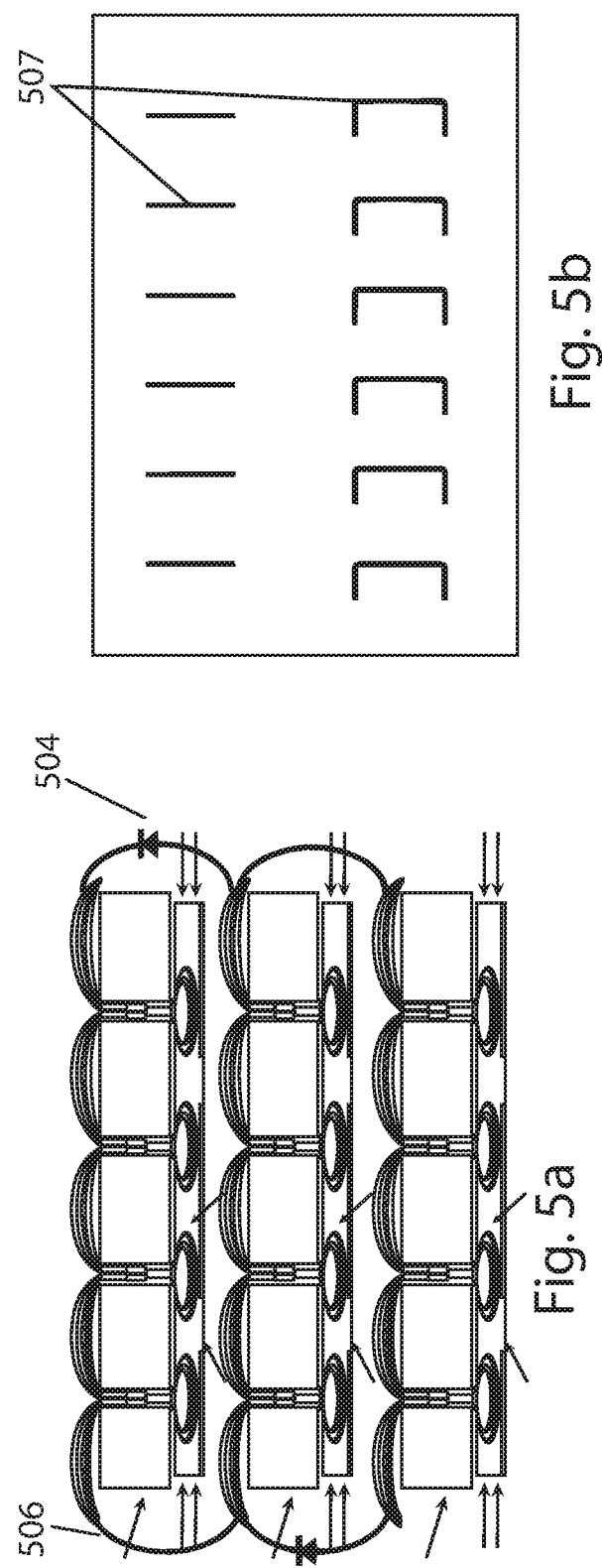

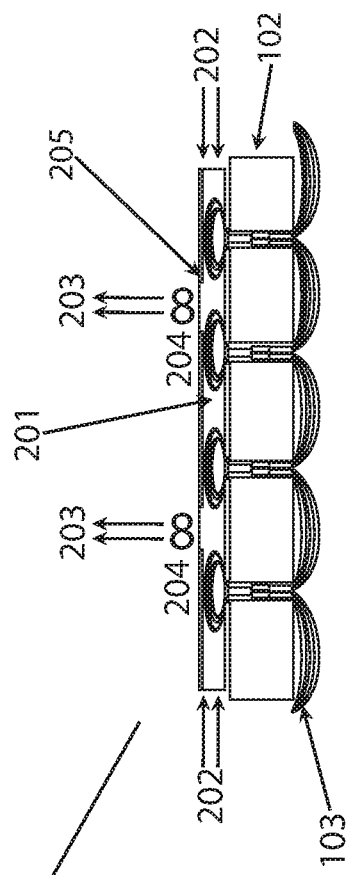
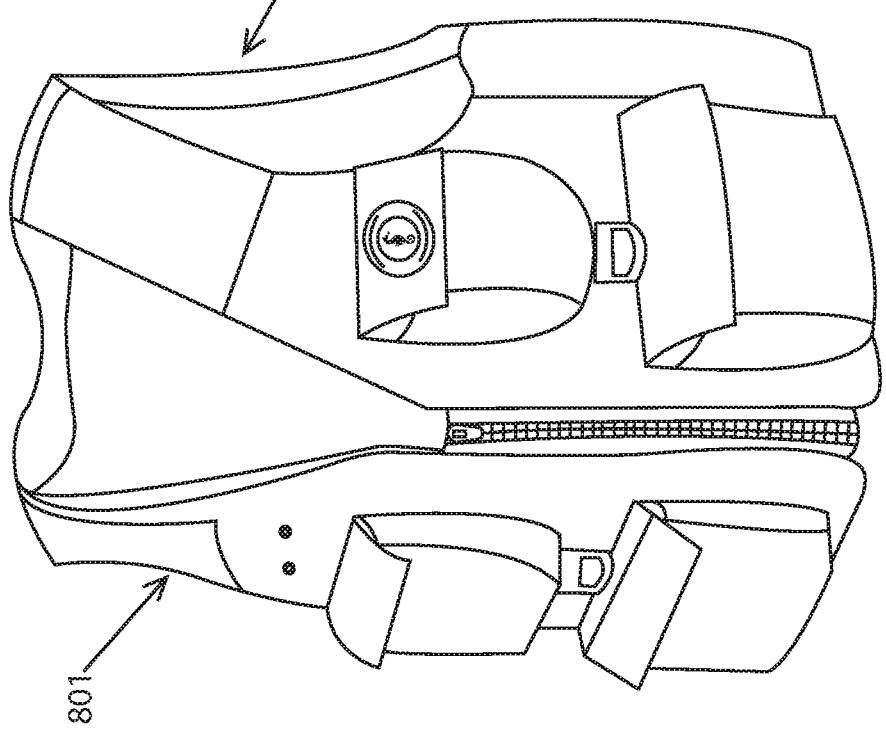

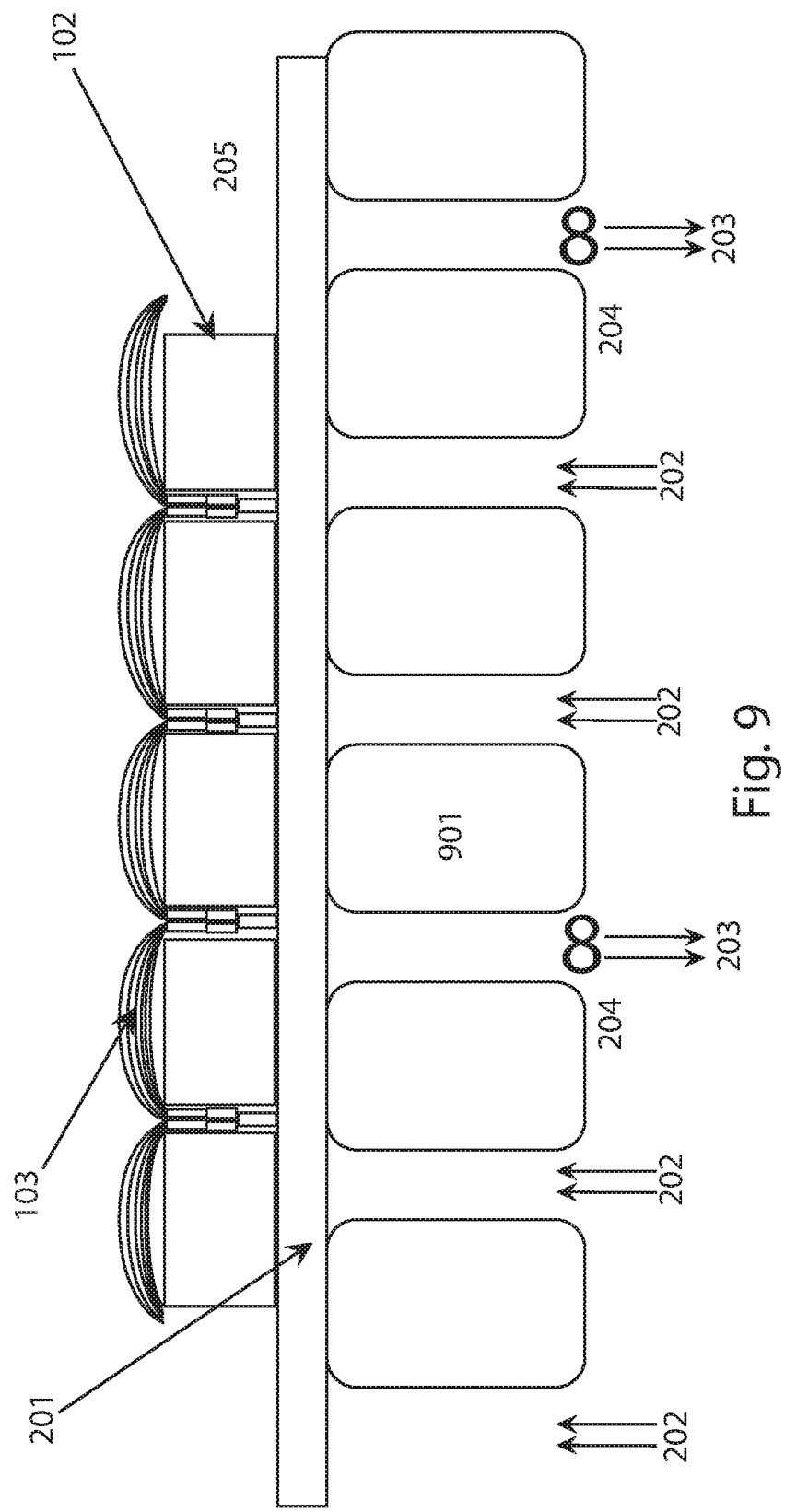

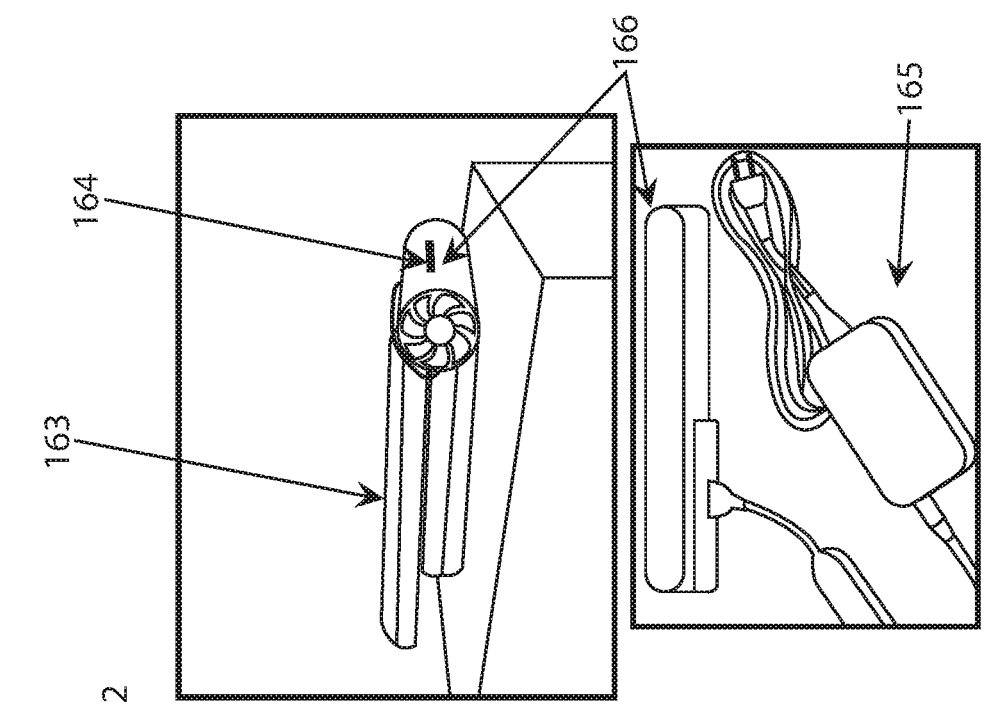
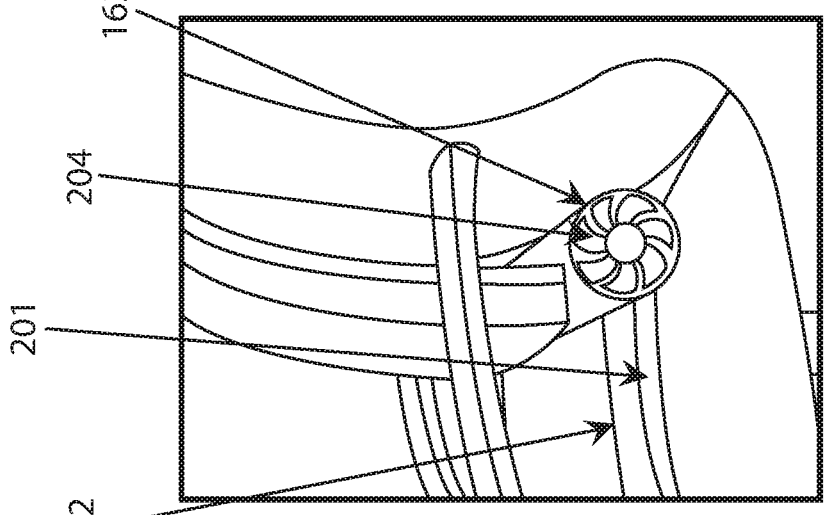
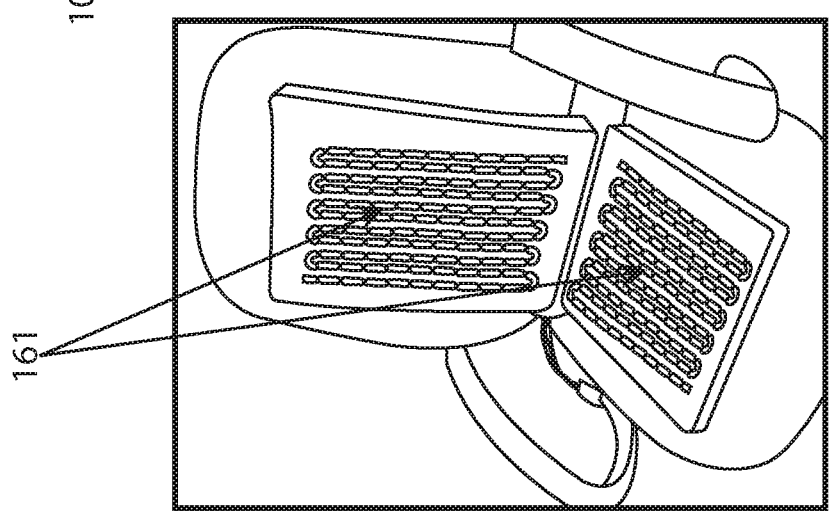
Fig. 15a
Fig. 15b
Fig. 15c

US 10,571,162 B2

INTEGRATION OF DISTRIBUTED THERMOELECTRIC HEATING AND COOLING

CROSS-REFERENCE

This application is a continuation of U.S. application Ser. No. 13/541,530, filed on Jul. 3, 2012, which claims priority to U.S. Provisional Patent Application Nos. 61/504,784, filed Jul. 6, 2011; 61/564,404, filed Nov. 29, 2011, and 61/587,729, filed Jan. 18, 2012, all of which are entirely incorporated herein by reference.

BACKGROUND

In our earlier U.S. patent application Ser. Nos. 13/101,015 filed May 4, 2011 and Ser. No. 13/394,288 filed Mar. 5, 2012 and PCT Application Ser. No. PCT/US11/51227 filed Sep. 12, 2011, we describe a thermoelectric heating and cooling system comprising a connected string of thermoelectric elements woven into an insulating panel, which may be comprised of a soft material like foam, memory foam, batting, or natural fabrics. A conductor material is expanded on either side of the panel to distribute heat on one side and cooling on the other. Such a material or surface upgraded with thermoelectric heating and cooling in this manner is called a distributed thermoelectric panel. In our earlier applications, integration of that insulating panel with mattresses, chairs, and blankets was also described. The end result was a relatively low cost, uniformly distributed addition of heating and cooling to bedding, seats, blankets, and other products.

SUMMARY

The present invention provides various enhancements and improvements to heated and cooled products over the prior art, and also integration of thermoelectric heating and cooling panels into bed tops, hospital beds, low-profile blankets, seat tops, vests, and thermally controlled storage containers.

More particularly, in accordance with the present invention, we provide a distributed thermoelectric heating and cooling panel comprised of compacted conductors inside an insulating material, and expanded conductors outside the insulating material, wherein the assemblies containing the thermoelectric elements are mounted substantially parallel to or at an acute angle relative to a long dimension of the panel. Orienting the assemblies containing the thermoelectric elements essentially parallel to or at an acute angle relative to a long dimension of the panel eliminates a lumpy feeling to the user resulting from positioning of the thermoelectric elements oriented vertically to a long dimension of the panel as was in the case of the prior art, and contributes to comfort for the user.

BRIEF DESCRIPTION OF THE DRAWINGS

Further features and advantages of the present invention will be seen from the following detailed description, taken in conjunction with the accompanying drawings, wherein like numerals depict like parts, and wherein FIG. 1a schematically illustrates an insulating panel and thermoelectric string in accordance with the present invention;

FIG. 2a is a cross sectional view showing a spacer mesh material in accordance with the present invention;

FIG. 2b illustrates integration of an insulating panel with the spacer mesh material of FIG. 2a in accordance with the present invention;

FIGS. 5a, 5c, and 5d illustrate the incorporation of diodes in a thermoelectric string in accordance with the present invention;

FIG. 5b illustrates the preparation of the insulating panel with slits to facilitate the use of pre-expanded conductors in accordance with the present invention;

FIGS. 8a and 8b illustrate another embodiment of the invention incorporated into clothing;

FIG. 9 illustrates yet another embodiment of the invention to minimize path length of air flow when access underneath is available;

FIG. 13a illustrates yet another embodiment of the invention, and FIG. 13b illustrates a magnified view of a transition area of FIG. 13a;

FIGS. 15a-15c illustrate yet another embodiment of the invention.

DETAILED DESCRIPTION

FIG. 1a shows a thermoelectric panel comprised of a thermoelectric string 103 woven into an elongate insulating panel 102 with the elements 101 running in an acute angle relative to the long dimension of the panel. In prior art panels, the thermoelectric string elements ran in a vertical orientation. Since these elements are somewhat rigid, with the elements positioned vertically, the feeling against the body was lumpy at the locations of the elements, especially under the weight of the user. With the angled design in FIG. 1a, the elements 101 are able to flatten out horizontally under pressure against the weight of the body eliminating the lumpy feeling.

Figure 1B:
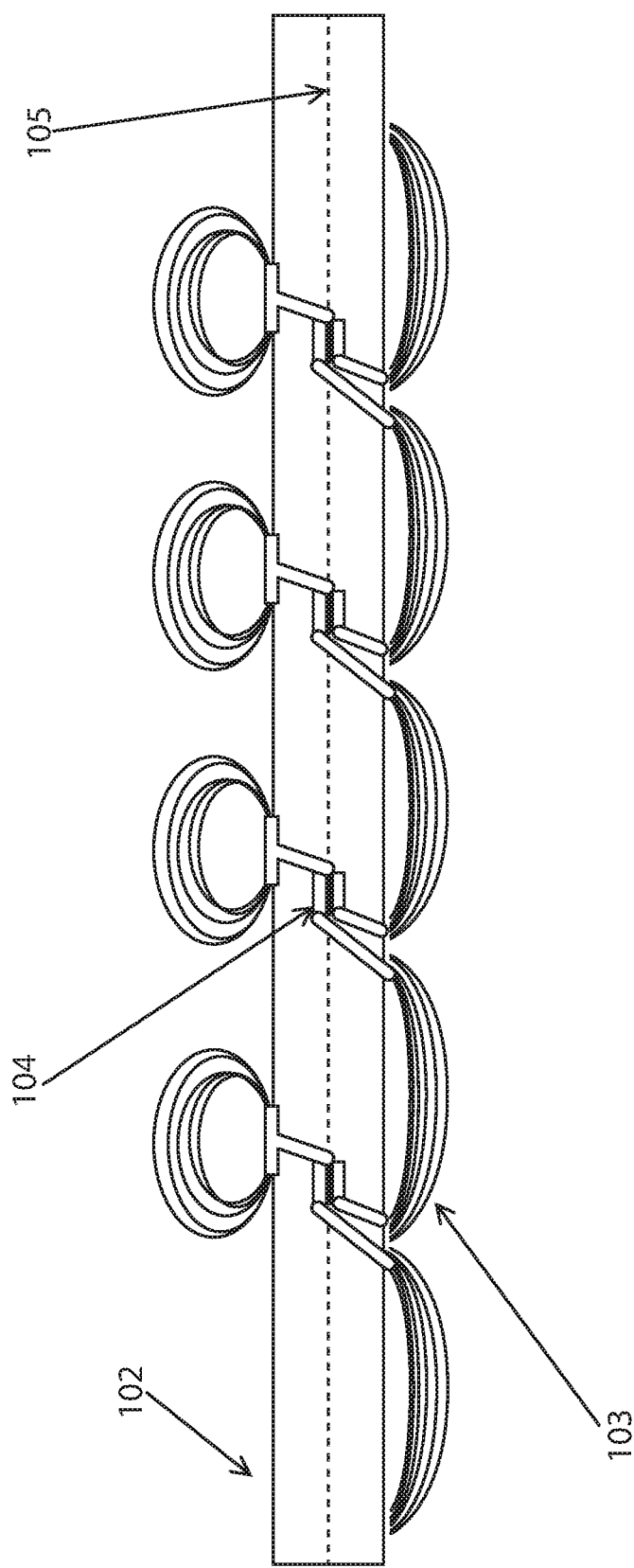
FIG. 1b schematically illustrates an insulating panel and thermoelectric string in accordance with the present invention.

FIG. 1b shows an alternative thermoelectric panel wherein the rigid elements 104 run essentially parallel to the long dimension of the panel, again eliminating the lumpy feeling. Because the entry holes and the exit holes of the string 103 are not co-linear, standard insertion techniques, e.g. such as poking through of the insulating material may not be possible. Hence, FIG. 1b shows the elongate insulating panel divided into two halves along a bond line 105. The elements 104 are placed between the halves, which is then re-bonded after assembly. Another approach is to inject the insulating material 102 into a mold with horizontally placed elements 104 so that the elements 104 will be molded in-situ oriented substantially parallel to or angled to the long dimension of the panel.

FIGS. 2a and 2b illustrate the provision of an air flow cavity to remove the heat from the hot side during cooling or to replenish heat from the environment during heating. A spacer mesh material 201 such as that available under the brand name "3mesh" from Müller Textil of Wiehl-Drabenderhöhe, Germany is used. The manufacturer describes this material as a two layer spacer fabric separated by an open mesh which provides a highly vacated cavity for airflow. The material is capable of supporting the pressure of a person sitting on the material without collapsing the cavity. This spacer mesh is oriented underneath an elongated heated and cooled panel surface 102 as shown in FIG. 2b. Fan(s) 204 provide air flow which removes heat via convection from the hot sides of the thermoelectric string 103. The spacer mesh 201 is sealed with an air-tight seal 205 in order to force the airflow into a desired path, in this case through the length of the spacer mesh 201. The configuration of FIG. 2b may be placed on top of a bed, the seat or back of a chair, or the surface of a stretcher or the seat or back of a wheelchair or any other surface 206, without limitation, where upgrade to a heated and cooled support surface is desired. Without limitation, the spacer mesh could be replaced with any porous material such as reticulated foam.

Figure 3:
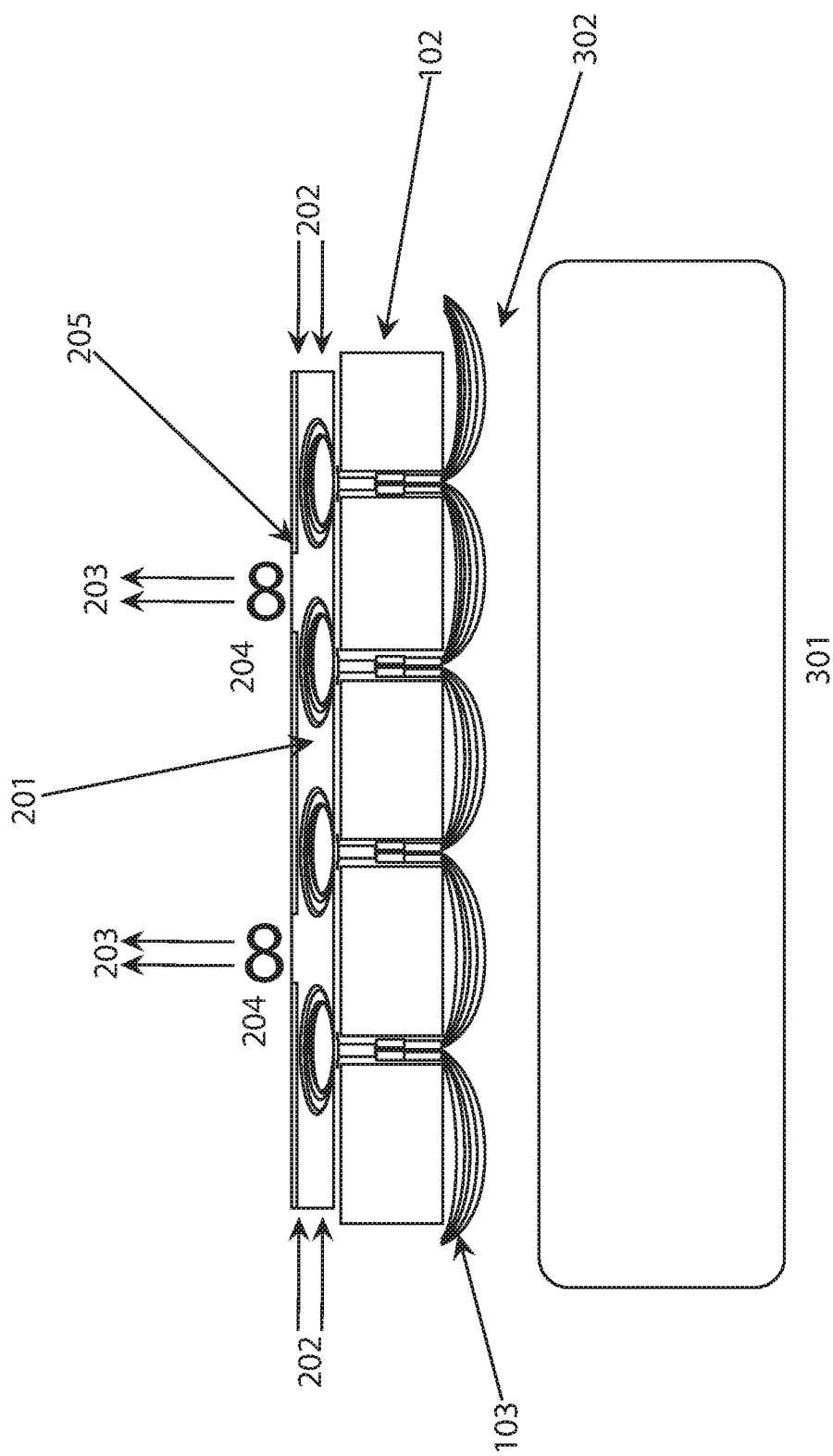
FIG. 3 illustrates integration of a thermoelectric panel with spacer mesh forming a blanket in accordance with the present invention.

FIG. 3 shows a configuration of a cooling blanket using the spacer mesh material 201. In this configuration, the spacer mesh material 201 may be softer because it does not need to support the weight of an individual. The spacer mesh 201 provides an air flow cavity above the cooled surface and lightweight fan(s) 203 can remove the heat via convection of air through the spacer mesh. Again, sealed wrapping material 205 is used to prevent the air from flowing where air flow is not desired. In the configuration of FIG. 3, the airflow is intended to flow in from the side inlets 202 and out through the outlets 203 vertically above the blanket. The expanded thermoelectric string 103 may become either warm or cold depending on the direction of the electrical current, which provides heating or cooling conductively in the areas in contact with the person sleeping while simultaneously heating or cooling the under blanket area 302 which largely functions as an insulated cavity.

Figure 4:
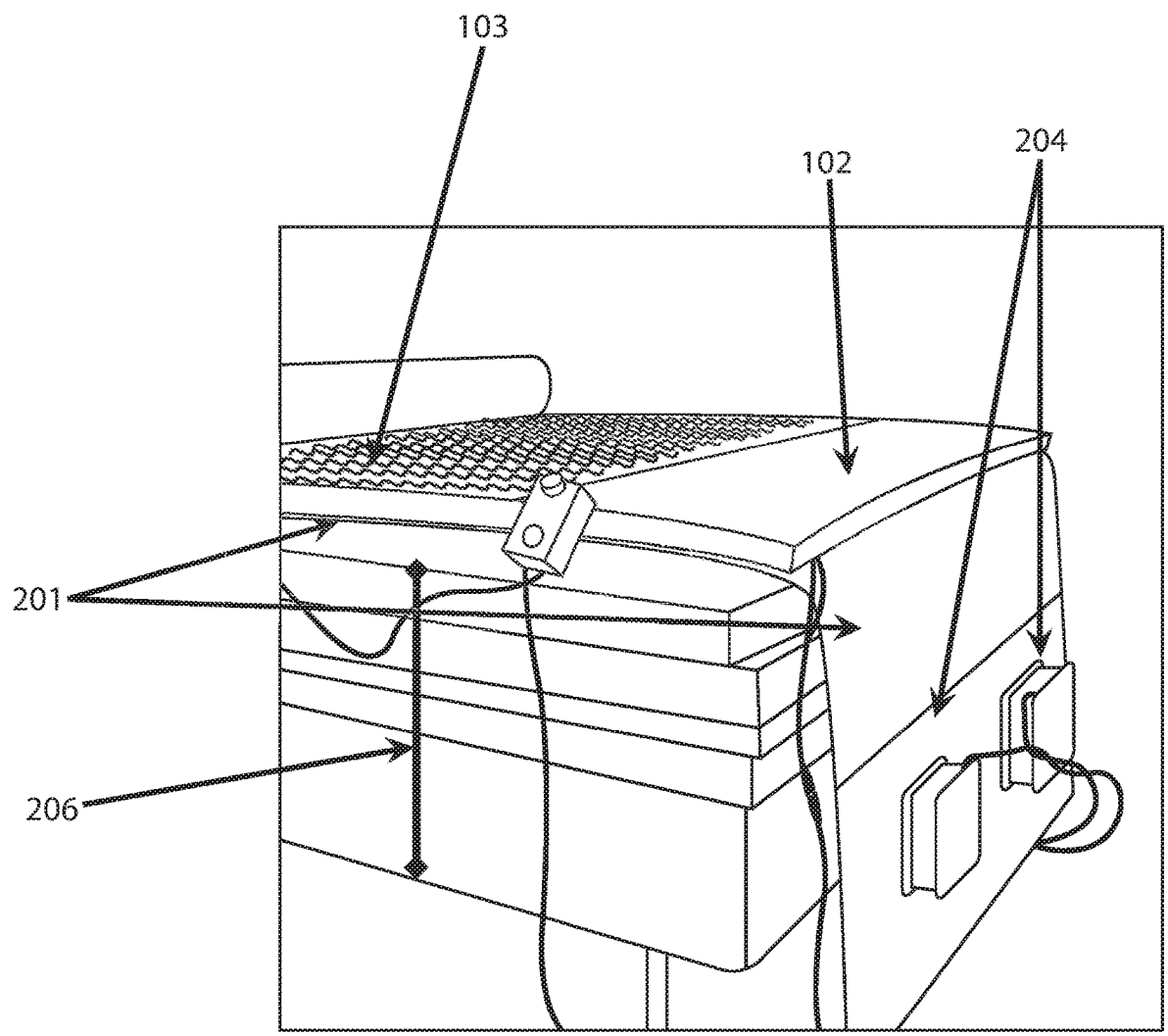
FIG. 4 is a prospective view showing a spacer mesh with a thermoelectric panel integrated into a mattress in accordance with the present invention.

FIG. 4 shows a spacer mesh 201 underneath the elongate thermoelectric panel 102. Fans 204 pull air from one end to the other, thereby removing heat from the hot side when the surface is being cooled. In this example, the surface is a mattress made up of many layers 206.

Referring now to FIGS. 5a, 5c, and 5d, in yet another embodiment, a distributed thermoelectric configuration in accordance with the present invention typically begins with a long string of expandable conductor connecting, in series, thermoelectric elements with alternating n and p types. This string is inserted into an insulating panel as shown in FIG. 5a. The nature of the series connection of some or all of the elements creates a single point of failure for each junction. If one junction becomes an open circuit, the current flow to all others in the series is interrupted. FIG. 5c and FIG. 5d show how a diode 504 can be used to provide electrical continuity across a faulty open junction. In FIG. 5d, each junction has a diode 504 that is soldered into joints 505 on copper pads 502 on small circuit boards 503 cut from a large circuit board 503 along cut lines 501 around the thermoelectric elements 508. If the thermoelectric element 508 becomes an open circuit, the parallel diode 504 will restore continuity with the degradation of the voltage drop across the diode reducing the overall voltage available to the remainder of the string. However, this loss of voltage is a minor, perhaps unnoticeable effect on performance, compared to the entire series becoming inoperable.

FIG. 5a shows an alternative method to introduce fault-tolerance. Here, a diode 504 is used to bridge across a subset of the series of strings connected by a plain wire 506. If any element or conductor in the series opens up electrically, the diode 504 provides continuity. In this case, a plurality of thermoelectric elements 508 are rendered inoperable, not just the one that failed. However, the number of diodes 504 required and hence the cost is less than the embodiment shown in FIGS. 5c and 5d. Without limitation, the diode could be replaced by an anti-fuse, or shunt, in which a permanent short circuit is made whenever the voltage across it reaches a certain level. Without limitation, any other electronic component providing a similar function may be used. Again without limitation, multiple diodes may be connected in series to protect a larger series of elements against an open circuit fault.

FIG. 5c also shows how the diodes 504 or anti-fuses can be mounted on the same board as the thermoelectric elements, allowing for inclusion of them to be automated with pick and place circuit board assembly.

FIG. 5b illustrates an improved design of an insulating panel that allows for faster and easier manufacturing. The prior-art assembly process involves poking the looped conductors into holes in the insulating panel. Then, the conductor is expanded on one or both sides of the panel. A simpler and less expensive assembly process is possible by cutting I-shaped or C-shaped slits 507 in the insulating panel shown in FIG. 5b. These slits 507 allow for thermoelectric strings with pre-expanded conductors to be inserted into the panel. The expanded conductor loops may be wrapped around the C-shaped slits in FIG. 5b. Or, if the conductor is pre-expanded into a wide but flat hairpin shape, then this conductor may be pushed through the width of the I-shaped slit 507 in FIG. 5b. Subsequently and repeatedly, the other sections are wrapped or pushed through the slits. The end result is a thermoelectric string stuffed into an insulating panel without requiring the expansion steps after insertion. Pre-expanded conductors also save assembly effort at the supplier of wire braid, for example, because this braid is normally compacted before shipment.

Figure 6:
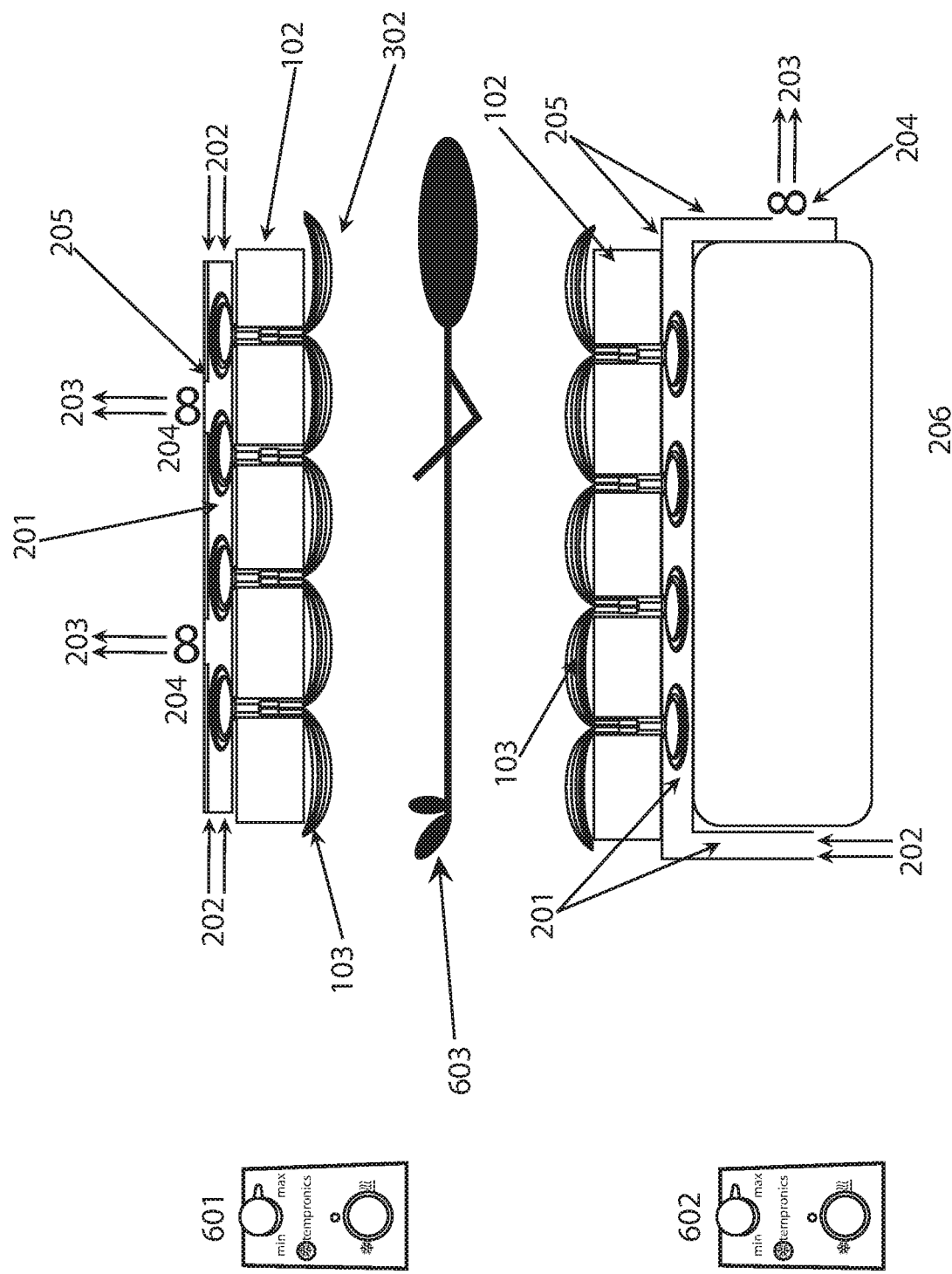
FIG. 6 illustrates a system comprising multiple heating and cooling surfaces, i.e. a blanket and a mattress, in accordance with the present invention.

FIG. 6 shows how multiple surfaces with heating and cooling controlled together or separately can provide advantages for a person in a bed 603. In this figure, the bed surface 206 below the user and the blanket above are both outfitted with thermoelectric heating and cooling systems in accordance with the present invention. The bed is controlled by one controller 602 and the blanket is controlled separately and independently by another controller 601.

Pressure ulcers, aka bed sores, form on the skin in areas that are under pressure for long periods of time. Immobile patients in a hospital bed or nursing bed are particularly susceptible to pressure ulcers in areas that contact the bed or seat surface which are under pressure. Medical researchers have determined that pressure ulcers are much less likely to form if the skin is cooled by 10 degrees Fahrenheit below the skin temperature without cooling. In FIG. 6, the person lying down 603 could set the temperature control 602 to cooling for the bed surface to prevent pressure ulcers. If the user becomes too cold overall by lying on a cooled surface, then the user 603 may adjust the controller 601 for the blanket above to provide heating and thereby counteract the underside cooling and restore thermal comfort. Without limitation, there may be personal preference or medical benefit for any combination of heating and cooling above and below the person 603 with any intensity of heating or cooling. Also without limitation, these heated and cooled surfaces may be applied to a surgical table, nursing bed, hospital bed, wheelchair, or other medical support surface.

Persons in wheelchairs are particularly vulnerable to pressure ulcers because of their lack of mobility, atrophied tissues, and poor circulation. These pressure ulcers typically form in the bony pelvic areas while seated. For this reason, medical device companies have developed special seat cushions with air or liquid bags that distribute the pressure evenly over the largest area possible. In order to provide the additional benefits of cooling on these fluid bags, the insulating panel 102 in FIG. 6 could be divided into sections of, for example, one square inch each, and each section would be able to shift vertically relative to other sections. In this way, the pressure distribution of the insulating panel 102 could be translated directly to the fluid bag which is optimized for wheelchair users. The spacer mesh 201 for the air flow is already very conformal laterally, but could be similarly cut into sections for even greater lateral conformance. Yet another alternative is to mount the cooling panel 102 and spacer mesh 201 underneath the fluid bag and use a thermally conductive fluid in the bag or add thermally conductive particles to the existing fluid.

Figure 7:
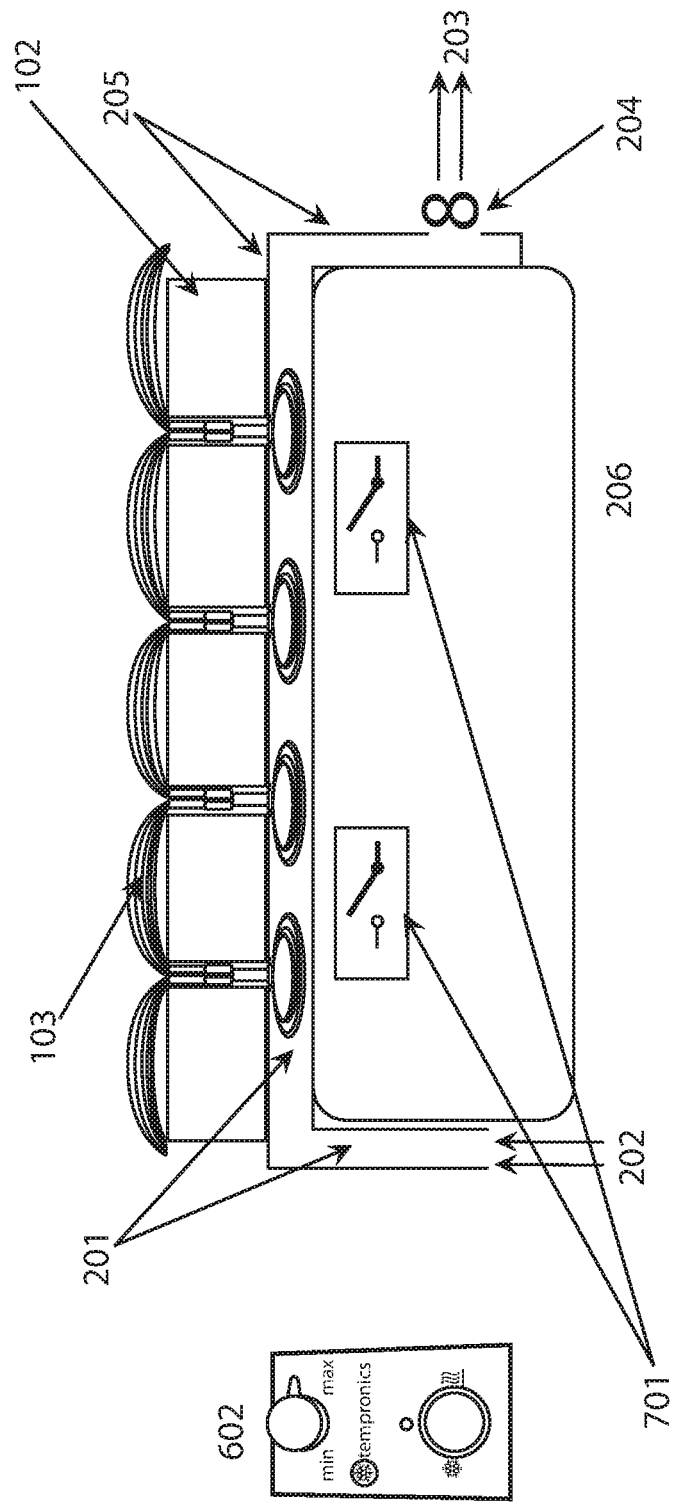
FIG. 7 shows another embodiment of the invention incorporated into a seat or mattress.

Another enhancement to thermoelectrically cooled and heated surfaces is to have the elements activated only when needed as opposed to all of the time. FIG. 7 shows how one or more switches or thermal or pressure sensors or motion detectors 701 may be embedded in or near the insulating layer 102 to turn on the thermoelectric elements in the area near the switch. Without limitation, one switch could activate/deactivate all of the elements for an entire chair or bed for saving power when not in use. Without limitation again, the switch could be replaced with a pressure sensor or motion detector that is sensed by the controller 602 and then the controller activates the elements as desired. The controller 602 may also be responsive to changes in sensed temperature and provide thermostatic or other control of the thermal environment.

FIGS. 8a and 8b show how a distributed thermoelectric panel 102 attached to spacer mesh 201 for heat removal via air flow may used as a lining in vests 801 or other clothing or apparel including, for example, jackets, shirts, pants, footwear, scarves, and hats, to achieve heating and cooling for the person wearing the clothing. The fans 204 move ambient air through the conductors thereby facilitating the insertion or removal of heat by the thermoelectric layer. The fans 204 may be placed, without limitation, on the back of the vest 801 or other garment to prevent the air flow from disturbing the user. Without limitation, the fans 204 and spacer mesh 201 could be eliminated and rely on the expanded loop portion of the thermoelectric string 103 to dissipate heat or cold to the environment via natural convection. As noted supra, apparel in these configurations may include shoes, shirts, pants, or other garments or hats.

FIG. 9 shows how the thermoelectric layer 102 combined with the spacer mesh 201 may be situated on top of a thicker cushion or mattress 901 and draw air out the underside. In this configuration, the surface is elevated over a hollow, exposed volume like an automobile seat or a bed on an elevated platform. The air is pulled in from the inlets 202, flows over the conductors of the thermoelectric string 103, and is then expelled out the bottom 203 by the fans 204. This configuration is particularly effective because the air is not drawn the full length of the thermoelectric layer, and heat does not build up from one end of the spacer mesh to the other.

Figure 10B:
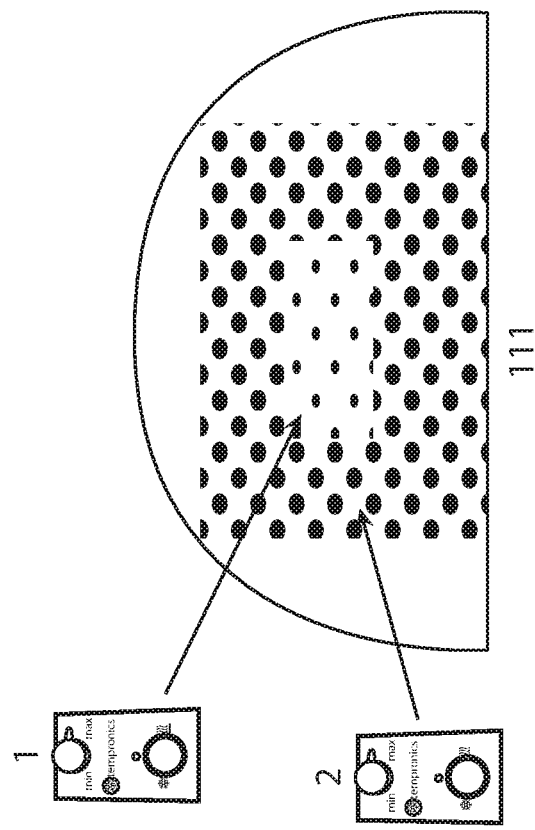
FIGS. 10a and 10b illustrate yet other embodiments of the invention incorporated into a mattress or seat bottom cushion.
Figure 10A:
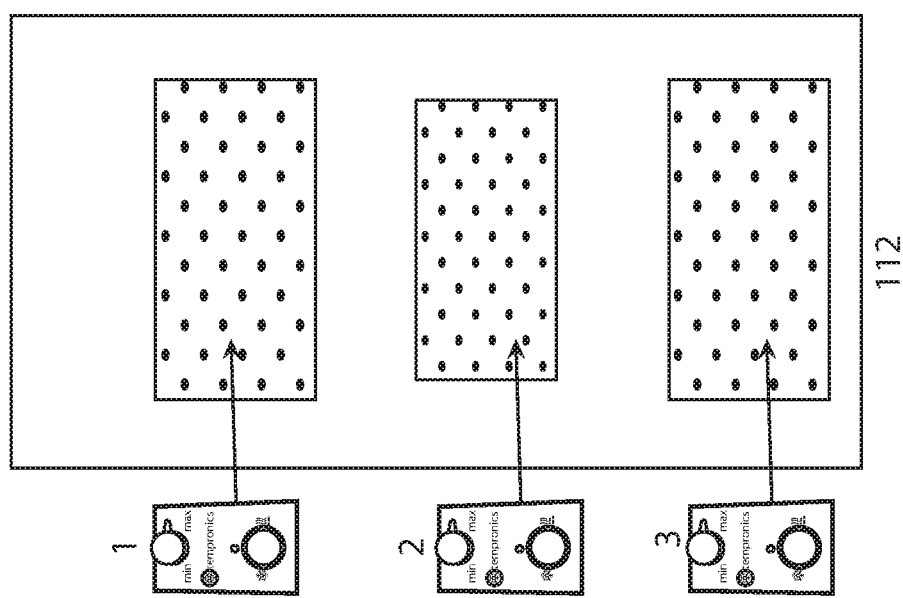

FIGS. 10a and 10b illustrate the enhancement of zoned heating and cooling wherein the presence of heating or cooling or its intensity is varied for a purpose. FIG. 10a shows the thermoelectric elements only placed in the areas of the bed 112 with high pressure against the body. These three zones are intended for the shoulder, waist, and feet. A separate controller for each zone allows for more precise control and to counterbalance the body's own variations in thermal regulations. In addition, the zone for the waist, which experiences the highest pressure, has a higher density of thermoelectric elements to provide proportionately more cooling or heating.

FIG. 10b illustrates the arrangement of thermoelectric elements for a seat, chair, or wheel chair 111. The pelvic area of the seat has a higher density of elements because this is the area of highest pressure, the area most susceptible to pressure ulcers, and also is a bony area with thin tissues between the bone and the skin. Allowing for greater cooling in the pelvic area is advantageous for pressure-ulcer prevention. The separately controller area outside the pelvic area could even be heated to restore the general thermal comfort of the user.

Figure 11:
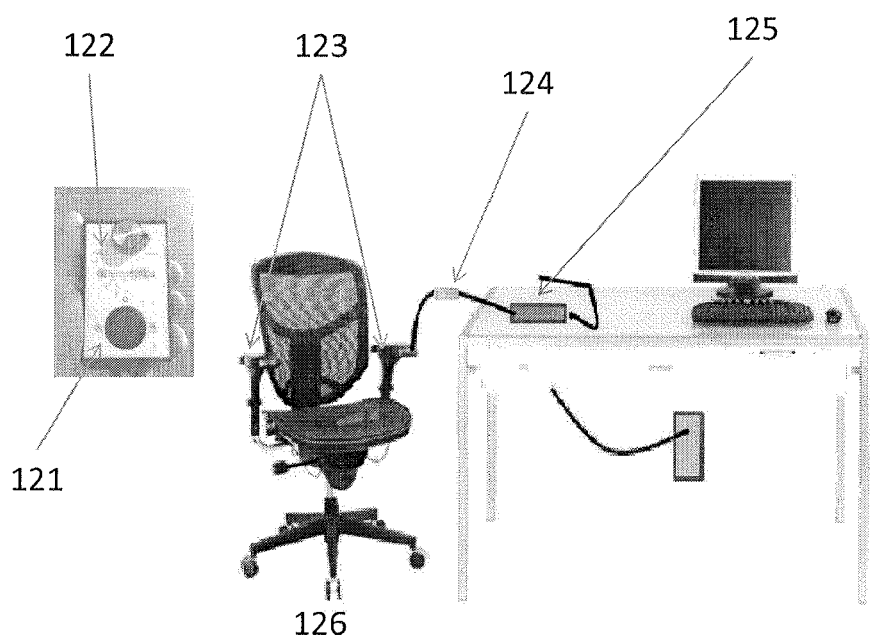
FIG. 11 illustrates yet another embodiment of the invention incorporated into an office chair.

FIG. 11 illustrates several enhancements to a chair 126 upgraded with distributed thermoelectric heating and cooling. Without limitation, these may be applied to other products and applications. FIG. 11 shows how the cord of the power supply 125 to the chair 126 may be connected on either side 123 to allow the user the choice of which side to conveniently enter and exit the chair. Without limitation, an inductive or other wireless power transfer mechanism could replace the wired connection. FIG. 11 also shows how a breakaway connector 124 may be placed inline or at either end of the cord such that any tension will disconnect the cord before any damage occurs if the user attempts to cross the cord when exiting or entering the chair 123. Without limitation, the breakaway mechanism 124 could be a magnetically attracted electrical connector such as those used on laptop computers or may be a loosely coupled electrical contact connector. FIG. 11 also indicates that controller mechanism 122 may be programmed with an auto shut off capability. Often, products like chairs and beds are used for lengths of time, and an auto shut off may turn off the heating or cooling after a period of time that is likely no longer needed. In addition, to assist a person sleeping or sitting in making sure that the thermoelectric heating or cooling has reached steady state prior to use, the controller 121 can monitor usage patterns and then pre-heat or pre-cool as appropriate.

Figure 12:
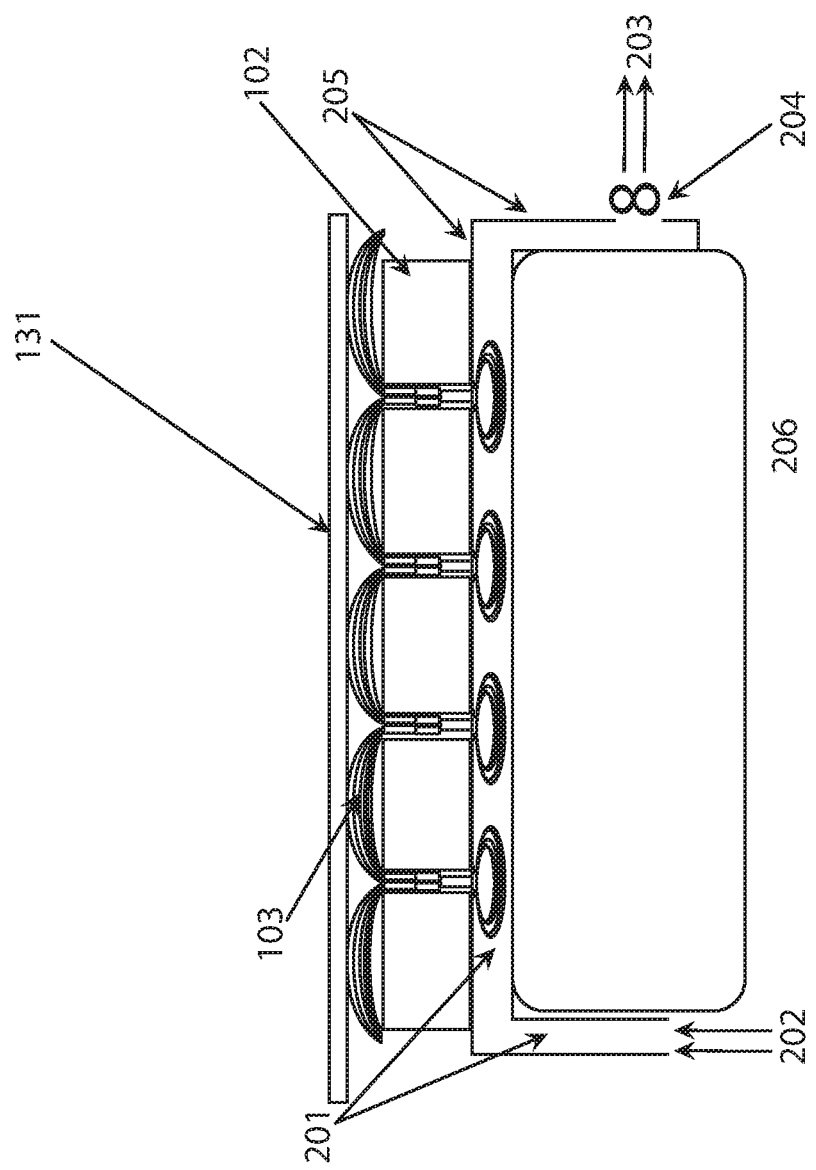
FIG. 12 illustrates yet another embodiment of the invention.

FIG. 12 shows a distributed thermoelectric panel 102 with a covering 131 that can accomplish a number of objectives: hiding the look or feel or both of the expanded conductors, conducting the heat in either direction effectively, making the surface waterproof, or making the surface cleanable. The cover material 131 may, without limitation, be comprised of material that changes phase at or near the skin temperature, such as paraffin or other wax with high thermal conductivity, polyethylene or high-density polyethylene fabric, neoprene rubber or vinyl or silicone or other gel mixed with fabric or not for waterproofing or fireproofing as well as high thermal conductivity, any of these or other materials with thermally conducting particles such as silicon, metals, or metal oxides. In addition, the cover 131 or the insulating layer 102 may have indentations with depth approximately equal to the thickness of the expanded conductors so as to hide the look and feel and eliminate bumps. In addition, this cover layer may be formed onto the surface or in combination with the expanded conductor 103, for example, by applying a liquid or paste that hardens into the final surface. Embedding the expanded conductor into the cover in this manner will increase the surface area of the conductor 103 touching the cover layer 131 thereby increasing the heat conduction into or out of the user in contact.

Figure 13:
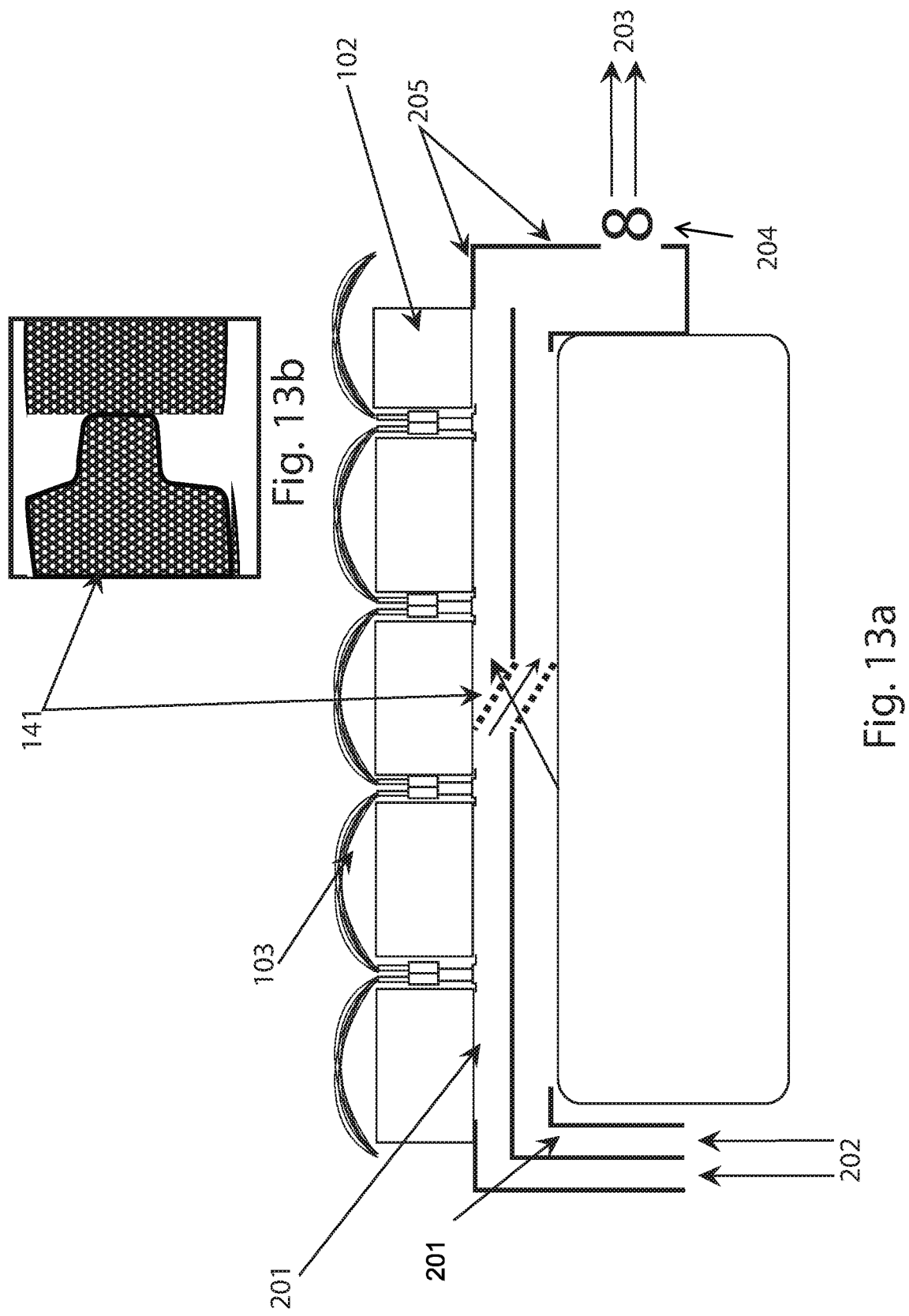

For some application such as a mattress pad to be placed on top of an existing bed, the air flow must travel a long distance such as the entire length of the bed and down each end. With air moving in one direction through a single path, heat (in cooling mode) or the lack of heat (in heating mode) can accumulate down the air path. This accumulation causes the performance of the cooling or heating to be worse towards the end of the air path and better near the beginning. In order to balance the performance and also to improve the overall performance, the diagram in FIGS. 13a and 13b show one way to mitigate this unwanted effect. Here, two layers of spacer mesh 201 are used. One layer provides the air path for the first half of the thermoelectric layer and the other layer provides the air for the second half. This configuration halves the accumulation length of the heat or lack of heat through the air path, thereby increasing overall performance and uniformity.

Figure 14:
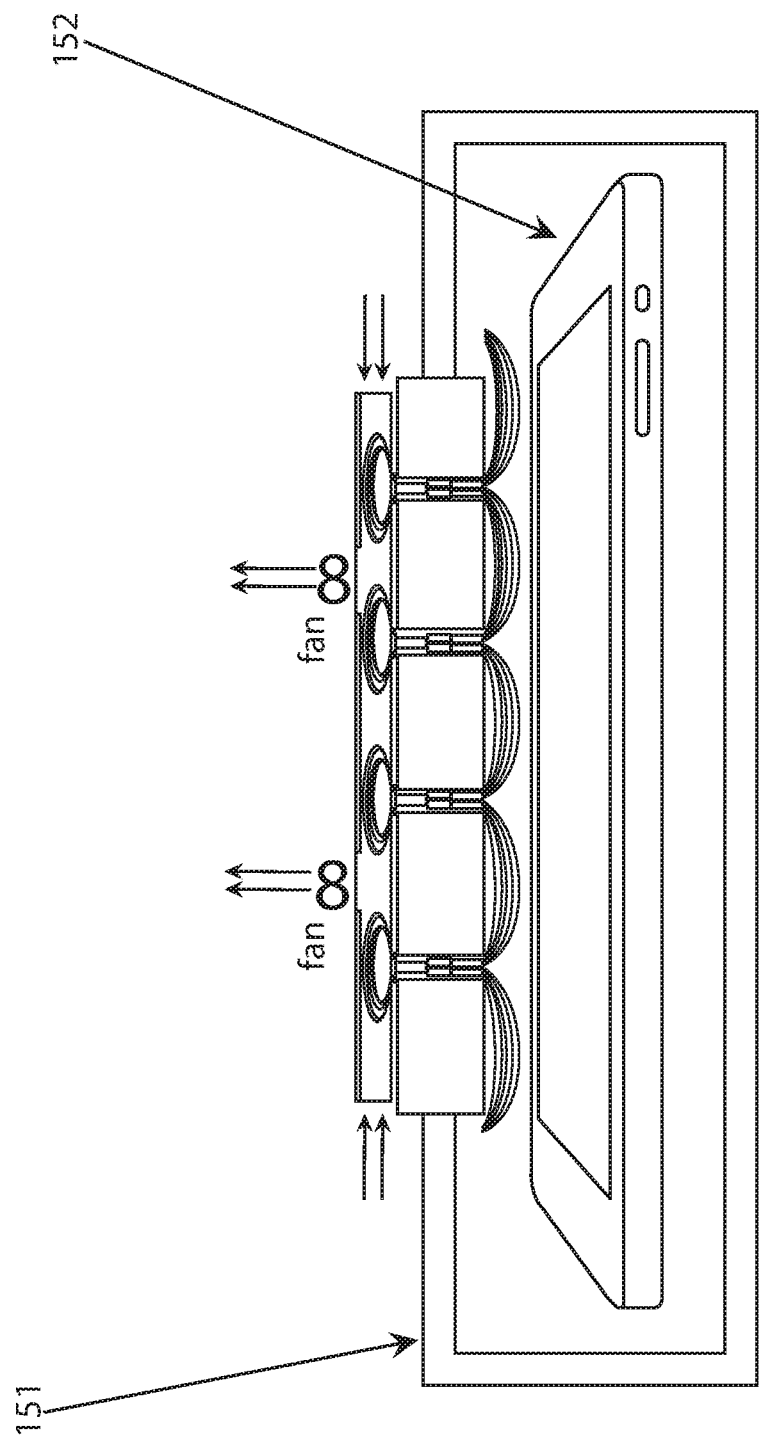
FIG. 14 illustrates yet another embodiment of the invention.

FIG. 14 shows yet another application for distributed heating or cooling. An insulated container 151 has one or more sides comprising a thermoelectric layer. This box can house items 152 that need to be kept cooler or warmer than the surrounding temperature. For example, portable electronics like laptop computers, iPads, and cellular phones have a range of temperatures required for storage, and this range is narrower than the temperature range inside of an automobile in the summer or winter. A container 151 with thermoelectric panel could keep the electronics or other sensitive item 152 cooler or warmer than the surroundings. Without limitation, this box could also house cosmetics, pharmaceuticals, chemicals, food, bait, or other perishable items.

FIGS. 15a-15c show how a cooled or heated seat topper is constructed using the aforementioned thermoelectric panel 102 with the spacer mesh 201 for air flow underneath. The inlet for the air into the spacer mesh 201 is at the very top of the back and at the very front of the seat. Without limitation, this inlet could be along the sides. The air from these inlets is pulled by a fan 204 in a tube 162 and exhausted to the environment. The direction of the air exit could be upwards, sideways, or out the end of the tube in order to accommodate a variety of placements of the topper. For example, placement on an airline seat might block the flow out the ends of the tube, but could allow exit upwards from the ends of the tube. This seat topper may be put into a folded position 163 and then be carried using a handle 164. The tube 162 may contain or attach a battery 166 to allow for cordless operation. A battery charger 165 is used to charge the battery in-situ or externally.

Various changes may be made without departure from the spirit and scope of the present invention.

We claim:

1. A thermoelectric system for heating or cooling, comprising:
   a panel comprising an electrically and thermally insulating material;
   a plurality of thermoelectric elements; and
   a plurality of conductors comprising (i) a compacted portion that is compacted in cross section inside the panel and (ii) an expanded portion that is expanded in at least one dimension outside the panel, wherein the expanded portion of the plurality of conductors projects away from and is disposed adjacent to a surface of the panel and directly connects one thermoelectric element to another thermoelectric element of the plurality of thermoelectric elements, wherein the plurality of thermoelectric elements comprises alternating n-type and p-type thermoelectric elements.

2. The thermoelectric system of claim 1, wherein the plurality of thermoelectric elements is parallel to the surface of the panel.

3. The thermoelectric system of claim 1, wherein the panel comprises a molded material and the plurality of thermoelectric elements is at least partially molded within the molded material.

4. The thermoelectric system of claim 1, wherein the panel comprises a fluid flow cavity adjacent to an opposite surface of the panel, wherein the expanded portion of the plurality of conductors projects into the cavity.

5. The thermoelectric system of claim 4, wherein the fluid flow cavity comprises a porous material, a spacer mesh, or a reticulated foam material.

6. The thermoelectric system of claim 4, further comprising at least one fan to facilitate flow of heat away from a hot side of the panel during cooling or to facilitate flow of heat to a cold side of the panel during heating.

7. The thermoelectric system of claim 6, wherein the at least one fan is in in fluid communication with the fluid flow cavity, and wherein the at least one fan is configured to facilitate fluid flow through the fluid flow cavity to facilitate heat flow to or from the plurality of thermoelectric elements.

8. The thermoelectric system of claim 4, further comprising at least one unsealed fluid inlet and at least one unsealed fluid outlet in fluid communication with the fluid flow cavity.

9. The thermoelectric system of claim 4, further comprising a seal adjacent to one or more surfaces of the fluid flow cavity.

10. The thermoelectric system of claim 1, wherein the plurality of thermoelectric elements is mounted to or encapsulated by a strain-relieving material.

11. The thermoelectric system of claim 10, wherein the strain-relieving material comprises a composite material, a polymeric material, glass, or a combination thereof.

12. The thermoelectric system of claim 1, further comprising an electronic component that is electrically in parallel with the plurality of thermoelectric elements, wherein the electronic component prevents a single point of failure from creating an open circuit fault and disrupting current flow to the plurality of thermoelectric elements.

13. The thermoelectric system of claim 12, wherein the electronic component comprises a diode, an anti-fuse, or a shunt.

14. The thermoelectric system of claim 1, further comprising a plurality of panels including the panel, wherein each of the plurality of panels is independently controllable.

15. The thermoelectric system of claim 1, further comprising at least one switch connected to a controller that activates or deactivates the plurality of thermoelectric elements.

16. The thermoelectric system of claim 15, wherein the at least one switch is a thermal sensor, pressure sensor, motion detector, or a combination thereof.

17. A thermoelectric system for heating or cooling, comprising
   a panel comprising an electrically and thermally insulating material;
   a plurality of thermoelectric elements comprising individual conductors that are (i) compacted in cross section inside the panel and (ii) expanded in at least one dimension outside the panel, wherein the individual conductors project away from and adjacent to a surface panel from one thermoelectric element to another thermoelectric element of the plurality of thermoelectric elements, wherein the plurality of thermoelectric elements comprises alternating n-type and p-type thermoelectric elements; and a thermally conductive cover adjacent to the surface of the panel, wherein the thermally conductive cover comprises a polymeric material, and wherein portions of the individual conductors that are expanded in the at least one dimension outside the panel are embedded in the cover.

18. A thermoelectric system for heating or cooling, comprising a panel comprising an electrically and thermally insulating material; and a plurality of thermoelectric elements comprising individual conductors that are (i) compacted in cross section inside the panel and (ii) expanded in at least one dimension outside the panel, wherein the individual conductors project away from and adjacent to a surface of the panel from one thermoelectric element to another thermoelectric element of the plurality of thermoelectric elements, wherein portions of the individual conductors that are expanded in the at least one dimension are at a first side of the panel, wherein the plurality of thermoelectric elements comprise loop portions on a second side of the panel that is opposite the first side of the panel, and wherein the plurality of thermoelectric elements comprises alternating n-type and p-type thermoelectric elements.

19. The thermoelectric system of claim 17, wherein the panel comprises a fluid flow cavity adjacent to an opposite surface of the panel, wherein the individual conductors project into the cavity.

20. The thermoelectric system of claim 18, wherein the panel comprises a fluid flow cavity adjacent to an opposite surface of the panel, wherein the individual conductors project into the cavity.

* * * * *